US012417966B2

(12) United States Patent
Farrell et al.

(10) Patent No.: US 12,417,966 B2
(45) Date of Patent: Sep. 16, 2025

(54) IPD COMPONENTS HAVING SiC SUBSTRATES AND DEVICES AND PROCESSES IMPLEMENTING THE SAME

(71) Applicant: WOLFSPEED, INC., Durham, NC (US)

(72) Inventors: Donald Farrell, Raleigh, NC (US); Marvin Marbell, Cary, NC (US); Jeremy Fisher, Raleigh, NC (US); Dan Namishia, Wake Forest, NC (US); Scott Sheppard, Chapel Hill, NC (US); Dan Etter, Durham, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 943 days.

(21) Appl. No.: 17/555,106

(22) Filed: Dec. 17, 2021

(65) Prior Publication Data

US 2023/0197587 A1      Jun. 22, 2023

(51) Int. Cl.
*H01L 23/495* (2006.01)
*H01L 23/00* (2006.01)
(Continued)

(52) U.S. Cl.
CPC .. *H01L 23/49589* (2013.01); *H01L 23/49575* (2013.01); *H01L 23/645* (2013.01);
(Continued)

(58) Field of Classification Search
CPC ......... H01L 23/49589; H01L 23/49575; H01L 23/645; H01L 23/647; H01L 24/85; H01L 24/48; H01L 2224/48245; H01L 23/057; H01L 23/4334; H01L 23/49537; H01L 2223/6611; H01L 2223/6616; H01L 2223/6644; H01L 2223/6655; H01L 2223/6661; H01L 2223/6683; H01L 23/66; H01L 23/053; H01L 23/15; H01L 25/16;
(Continued)

(56) References Cited

U.S. PATENT DOCUMENTS 7,078,310 B1    7/2006  Kar-Roy et al.
8,143,699 B2    3/2012  Ching et al.
(Continued)

FOREIGN PATENT DOCUMENTS

JP    S64-013144 U    1/1989
JP    2002-093920 A   3/2002
(Continued)

OTHER PUBLICATIONS

International Patent Application No. PCT/US2022/081752; Int'l Search Report and the Written Opinion; dated Sep. 21, 2023; 12 pages.
(Continued)

*Primary Examiner* — Robert G Bachner
(74) *Attorney, Agent, or Firm* — BakerHostetler

(57) ABSTRACT

A transistor device includes a metal submount; a transistor die arranged on said metal submount; at least one integrated passive device (IPD) component that includes a substrate arranged on said metal submount; and one or more interconnects extending between the transistor die and the at least one integrated passive device (IPD) component. The substrate includes a silicon carbide (SiC) substrate.

34 Claims, 20 Drawing Sheets

(51) Int. Cl.
  *H01L 23/64* (2006.01)
  *H10D 30/47* (2025.01)
  *H10D 30/65* (2025.01)
  *H10D 62/832* (2025.01)
  *H10D 62/85* (2025.01)
  *H10D 84/83* (2025.01)

(52) U.S. Cl.
  CPC ............ *H01L 23/647* (2013.01); *H01L 24/85* (2013.01); *H01L 24/48* (2013.01); *H01L 2224/48245* (2013.01); *H10D 30/47* (2025.01); *H10D 30/65* (2025.01); *H10D 62/8325* (2025.01); *H10D 62/8503* (2025.01); *H10D 84/83* (2025.01)

(58) Field of Classification Search
  CPC .. H01L 2924/1033; H01L 2924/13064; H10D 30/47; H10D 30/65; H10D 62/8325; H10D 62/8503; H10D 84/83
  See application file for complete search history.

(56) References Cited

U.S. PATENT DOCUMENTS

| | | | |
|---|---|---|---|
| 9,153,504 B2 | 10/2015 | Lai et al. | |
| 9,966,426 B2 | 5/2018 | Mudakatte et al. | |
| 10,290,701 B1 | 5/2019 | Chang | |
| 2004/0061214 A1* | 4/2004 | Crescenzi, Jr. | H01L 23/66 257/691 |
| 2005/0121744 A1 | 6/2005 | Chang et al. | |
| 2007/0297120 A1 | 12/2007 | Ren et al. | |
| 2011/0031586 A1 | 2/2011 | Kang et al. | |
| 2013/0264716 A1* | 10/2013 | Lin | H01L 25/16 257/773 |
| 2013/0284507 A1 | 10/2013 | Hattori et al. | |
| 2014/0036405 A1 | 2/2014 | Takeoka et al. | |
| 2015/0244410 A1 | 8/2015 | Leong et al. | |
| 2015/0310981 A1 | 10/2015 | Yen et al. | |
| 2016/0126905 A1 | 5/2016 | Zhao et al. | |
| 2018/0131329 A1 | 5/2018 | Tong | |
| 2018/0323159 A1 | 11/2018 | Kamgaing et al. | |
| 2020/0204119 A1 | 6/2020 | Roberts et al. | |
| 2020/0227366 A1 | 7/2020 | Dogiamis et al. | |
| 2020/0411555 A1 | 12/2020 | Hall et al. | |
| 2021/0126593 A1 | 4/2021 | Roberts et al. | |
| 2021/0175860 A1 | 6/2021 | Roberts et al. | |
| 2021/0175866 A1 | 6/2021 | Li et al. | |
| 2021/0202408 A1 | 7/2021 | Khalil et al. | |
| 2021/0265249 A1* | 8/2021 | Komposch | H03F 3/195 |
| 2021/0265250 A1 | 8/2021 | Marbell et al. | |
| 2021/0313285 A1 | 10/2021 | Noori et al. | |
| 2021/0313293 A1* | 10/2021 | Noori | H01L 23/047 |
| 2021/0391234 A1 | 12/2021 | Lan et al. | |

FOREIGN PATENT DOCUMENTS

WO  WO 2021/167822 A1  8/2021
WO  WO 2021/202076 A1  10/2021

OTHER PUBLICATIONS

International Patent Application No. PCT/US2022/081740; Int'l Search Report and the Written Opinion; dated Mar. 10, 2023; 9 pages.

International Patent Application No. PCT/US2022/081759; Int'l Search Report and the Written Opinion; dated Mar. 16, 2023; 11 pages.

* cited by examiner

IPD COMPONENTS HAVING SiC SUBSTRATES AND DEVICES AND PROCESSES IMPLEMENTING THE SAME

FIELD OF THE DISCLOSURE

The disclosure relates to integrated passive device (IPD) components having silicon carbide (SiC) substrates, a device implementing IPD components having SiC substrates, a process of implementing IPD components having SiC substrates, a process for implementing a device having IPD components having SiC substrates, and/or the like.

BACKGROUND OF THE DISCLOSURE

Transistor packages such as radio frequency (RF) power amplifier transistor products implement IPD components. Typically, the IPD components are mounted on printed circuit board (PCB) based substrates, silicon (Si) based substrates, and/or the like. However, the PCB based substrates, Si-based substrates, and/or the like have a number of drawbacks including high manufacturing cost, high manufacturing complexity, and longer manufacturing times.

Accordingly, what is needed is IPD components, a RF product that implements IPD components, and/or the like configured for reducing manufacturing cost, manufacturing complexity, and manufacturing times.

SUMMARY OF THE DISCLOSURE

One general aspect includes a transistor device, that includes a metal submount; a transistor die arranged on said metal submount; at least one integrated passive device (IPD) component may include a substrate arranged on said metal submount; and one or more interconnects extending between the transistor die and the at least one integrated passive device (IPD) component, where the substrate may include a silicon carbide (SiC) substrate.

One general aspect includes a process for implementing a transistor device, that includes providing a metal submount; arranging a transistor die on said metal submount; arranging at least one integrated passive device (IPD) component may include a substrate arranged on said metal submount; and connecting one or more interconnects between the transistor die and the at least one integrated passive device (IPD) component, where the substrate may include a silicon carbide (SiC) substrate.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
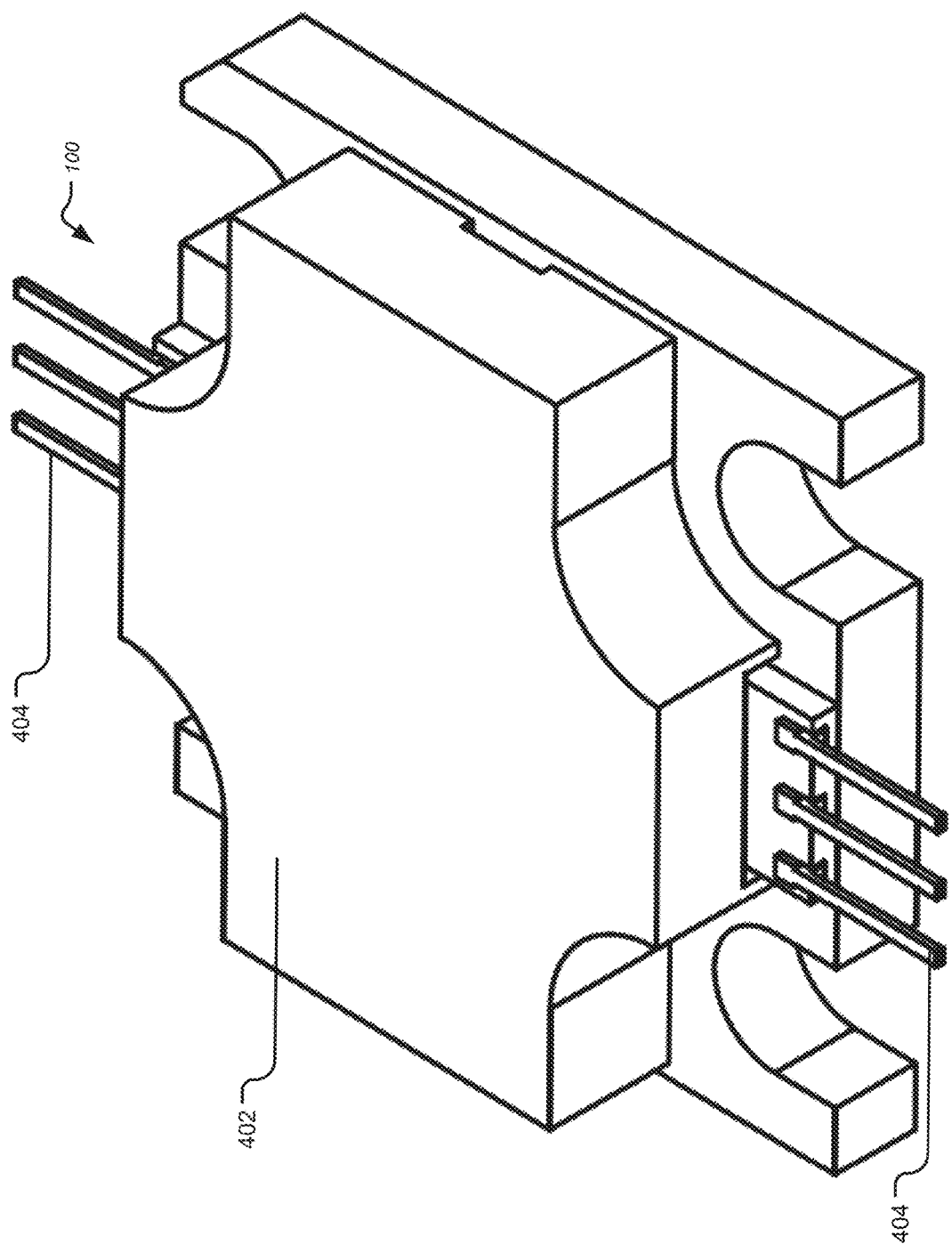
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure is directed to IPD components. In particular, IPD components implementing a SiC Monolithic Microwave Integrated Circuit (MMIC) process modified to provide a simpler, faster, and/or cheaper process for creating integrated passive devices (IPDs). For example, IPD components implementing Gallium nitride (GaN) with a SiC MMIC process modified to provide a simpler, faster, and/or cheaper process for creating integrated passive devices (IPDs). In aspects, the SiC IPDs can be combined with discrete GaN on a SiC transistor die and interconnected with wire-bonds in a packaged RF product. In aspects, the IPDs and transistor die can be re-used in multiple applications, products, and/or the like and the inter-connecting wire bonds can be used for adjusting and tuning a needed inductance. This avoids having to re-fabricate a full MMIC chip for different applications, products, and/or the like.

In aspects, the SiC IPDs may implement an array of spiral coil inductors on a SiC substrate that may provide a means of creating a shunt tuning element with direct contact to a substrate with high thermal conductivity that may be used at a high current and/or a high power level without overheating. In aspects, the IPDs on SiC may have lower thermal resistance than other IPDs, so the IPDs implemented on a SiC substrate may be used in higher power and/or higher temperature applications.

In aspects, the SiC IPDs may have a lower cost for the complete product. A full MMIC will use the higher cost process for both active and passive components, whereas with this approach, the active die (high cost) may be restricted to a small form factor, and the rest of the passive components fabricated with a lower cost simpler process as disclosed. Once the SiC IPDs are combined into the RF packaged product, the total cost is less than a full MMIC chip.

In aspects, the SiC IPDs may implement Metal-Insulator-Metal (MIM) capacitors on a SiC substrate that may be configured have higher breakdown voltage and better reliability than capacitors on other substrate types, utilizing other materials, and/or utilizing other processes, such as for example Si or GaAs. Since the requirements for a passive device process is less restrictive than for an active die process, wafers that may have been scrapped for die and/or epi growth may be utilized as they may still pass the criteria for use in the disclosed IPD process, thus increasing the yield of SiC substrates.

In aspects, the IPDs on SiC substrate may have much lower losses than IPDs on, for example a Si substrate, due to high volume resistivity of SiC. In aspects, the IPDs on SiC substrate may implement coils on the SiC IPDs that can achieve higher Q (>30) versus low resistance Si (<10). Similarly, SiC capacitors may have higher Qs than other types of capacitors. Lastly, there may be much less loss in a return path of wirebonds extending over the SiC IPDs, which leads to lower insertion loss of a whole device, such as prematch device.

The disclosure further relates to a radio frequency (RF) package implementing a radio frequency (RF) device with IPD components having SiC substrates. The disclosure further relates to a radio frequency (RF) power amplifier transistor package implementing an RF device with IPD components having SiC substrates. The disclosure further relates to a process of making IPD components having SiC substrates. The disclosure further relates to a process of making a package implementing IPD components having SiC substrates. The disclosure further relates to a process of making an RF package implementing an RF device with IPD components having SiC substrates components. The disclosure further relates to a process of making a Radio frequency (RF) power amplifier transistor package implementing IPD components having SiC substrates components.

FIG. 1 illustrates a perspective view of a package according to the disclosure.

Figure 2:
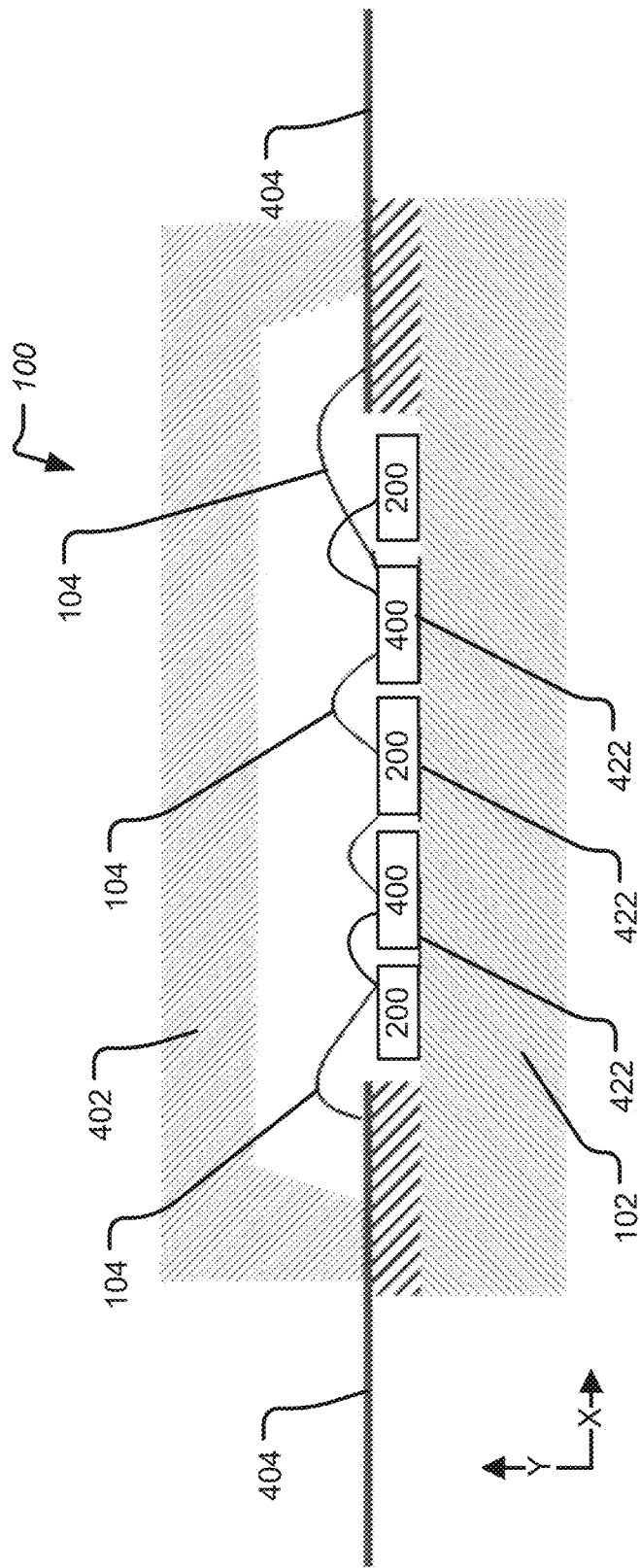
FIG. 2 illustrates a cross-sectional view of the package according to FIG. 1.

FIG. 2 illustrates a cross-sectional view of the package according to FIG. 1.

The aspects of FIG. 1 and FIG. 2 may include any one or more features as described herein. In particular, FIG. 1 and FIG. 2 show an exemplary implementation of a package 100 that may include any one or more other features, components, arrangements, and the like as described herein. In particular, FIG. 1 and FIG. 2 show the package 100 that may be implemented as a RF package, a RF amplifier package, a RF power amplifier package, a RF power transistor package, a RF power amplifier transistor package, and/or the like as described herein.

The package 100 may include one or more semiconductor devices 400, a support 102, and at least one or more of an IPD component 200. In aspects, the package 100 may include a plurality of the IPD component 200; and in aspects the package 100 may include a single implementation of IPD component 200.

In aspects, the IPD component 200 may be implemented as an IPD and may be implemented as a SiC IPD component, an IPD component having a SiC substrate, and/or the like.

The IPD component 200 may be implemented as at least part of a RF device as described herein. The IPD component 200 may implement matching networks, harmonic termination circuitry, integrated passive devices (IPD), capacitors, resistors, inductors, and/or the like.

In aspects, the IPD component 200 may be used for matching networks, pre-matching, bias-decoupling, thermal-grounding, and/or the like in RF power products and/or the like. The IPD component 200 may be placed inside a package, such as an open cavity package or over-mold package, together with transistor die, such as Gallium nitride (GaN) transistor die, and other capacitors, IPDs, and/or the like and connected with wire bonds to each other and to package leads. Metallization on the top and bottom of the substrate, together with vias routed through the substrate may enable the creation of bond-pads, inductive strips, inductive coils, capacitive stubs, and/or the like.

In aspects, the IPD component 200 may have high volume resistivity and low leakage of SiC substrates may contribute to high-Q and low loss IPDs. The one or more semiconductor devices 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

The package 100 may be implemented to include an open cavity configuration suitable for use with the IPD component 200 of the disclosure. In particular, the open cavity configuration may utilize an open cavity package design. In some aspects, the open cavity configuration may include a lid or other enclosure for protecting interconnects, circuit components, the IPD component 200, the one or more semiconductor devices 400, and/or the like. The package 100 may include a ceramic body 402 and one or more metal contacts 404.

Inside the package 100, the one or more semiconductor devices 400 may be attached to the support 102 via a die attach material 422. One or more interconnects 104 may couple the one or more semiconductor devices 400 to a first one of the one or more metal contacts 404, a second one of the one or more metal contacts 404, the IPD component 200, and and/or the like. Additionally, inside the package 100, the IPD component 200 may be arranged on the support 102 via a die attach material 422 with the one or more interconnects 104 shown in an exemplary configuration that may connect between the package 100, the IPD component 200, and/or the one or more semiconductor devices 400. The support 102 may dissipate the heat generated by the one or more semiconductor devices 400 and the IPD component 200 while simultaneously isolating and protecting the one or more semiconductor devices 400 and the IPD component 200 from the outside environment. In aspects, the die attach material 422 may utilize an adhesive, soldering, sintering, eutectic bonding, thermal compression bonding, ultrasonic bonding/welding, a clip component, and/or the like as described herein.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to a plurality of interconnect pads of components of the package 100 by an adhesive, soldering, sintering, eutectic bonding, thermal compression bonding, ultrasonic bonding/welding, a clip component, and/or the like as described herein.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Figure 3:
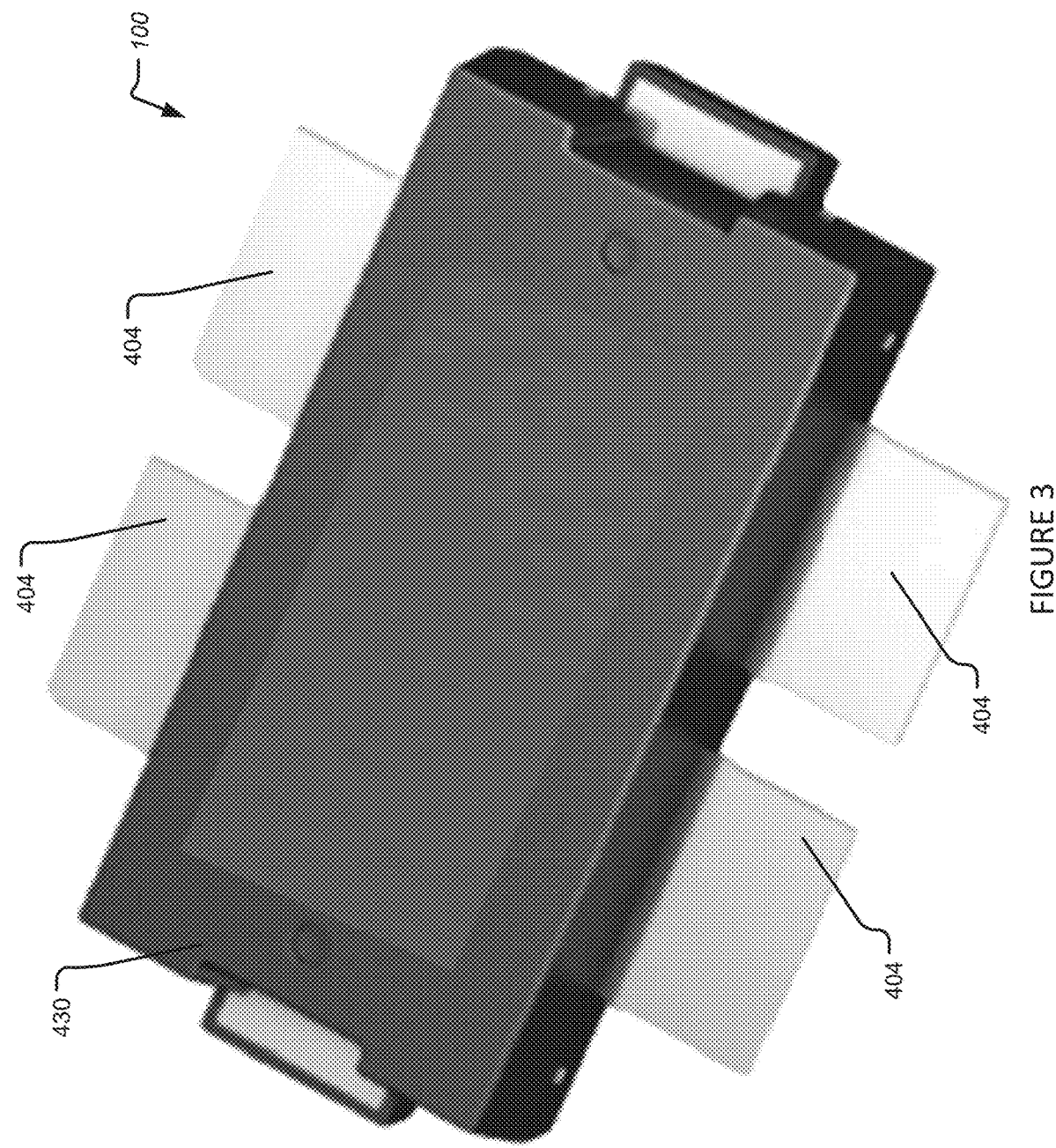
FIG. 3 illustrates a perspective view of a package according to the disclosure.

FIG. 3 illustrates a perspective view of a package according to the disclosure.

Figure 4:
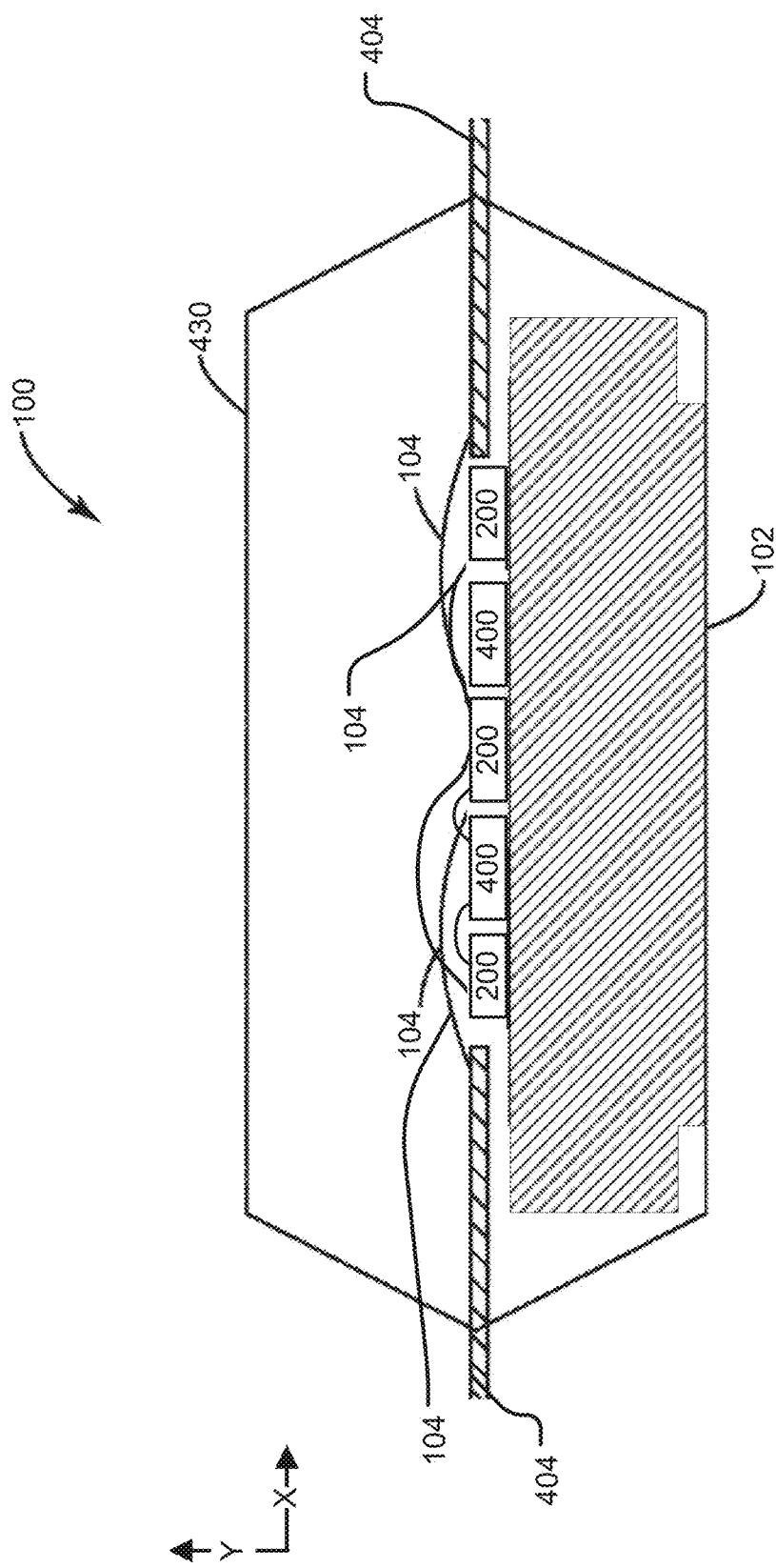
FIG. 4 illustrates a cross-sectional view of the package according to FIG. 5.
Figure 5:
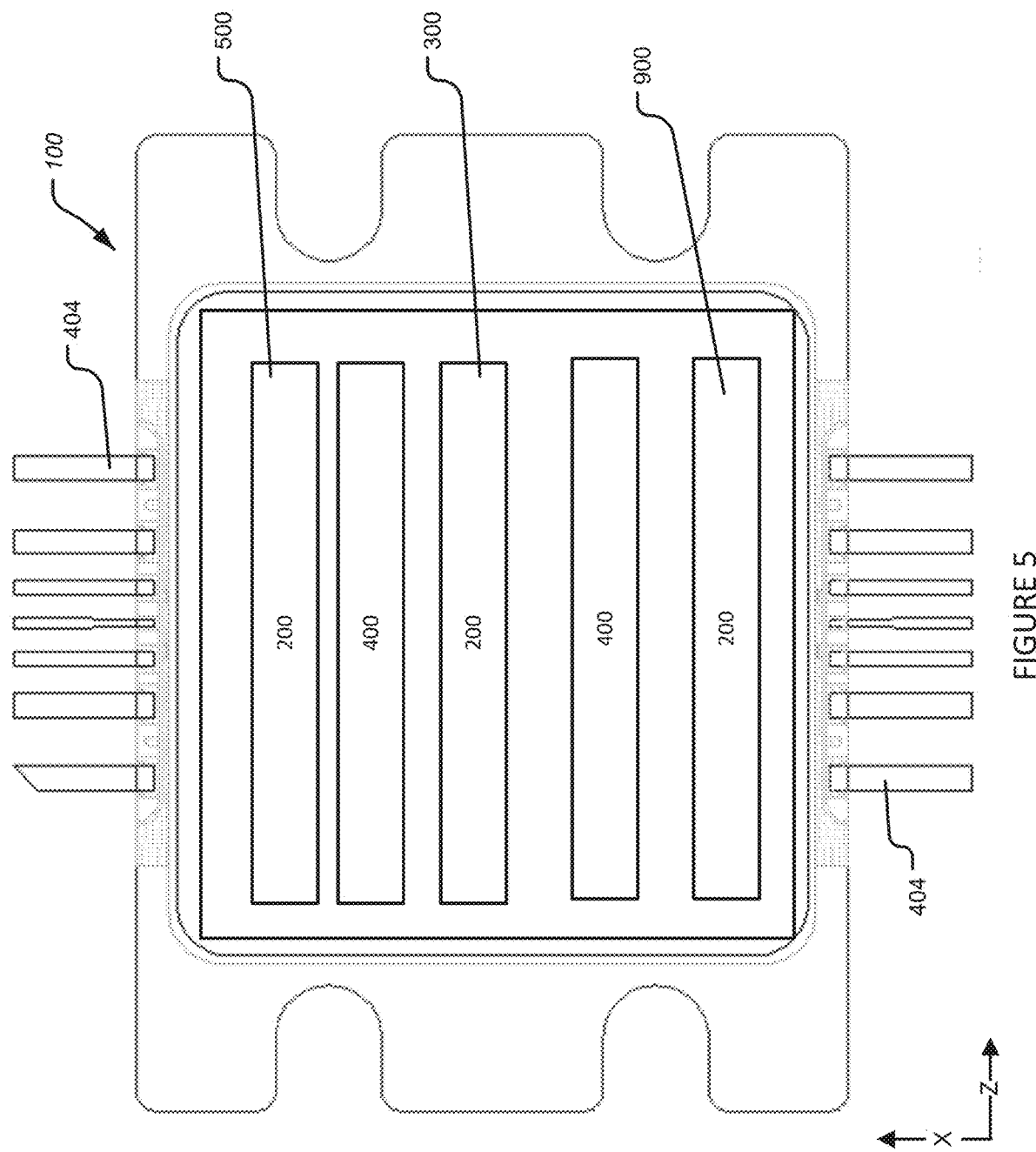
FIG. 5 illustrates a partial top view of the package according to a particular aspect of the disclosure.

FIG. 4 illustrates a cross-sectional view of the package according to FIG. 5.

In particular, FIG. 3 and FIG. 4 show another exemplary implementation of the package 100 that may include any one or more other features, components, arrangements, and the like as described herein. In particular, FIG. 3 and FIG. 4 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the IPD component 200, and/or the like.

Additionally, inside the package 100, the IPD component 200 may be arranged on the support 102 as described herein with the one or more interconnects 104 shown in an exemplary configuration. Moreover, inside the package 100, the IPD component 200 and may be arranged on the support 102. The package 100 may include an over-mold 430, one or more metal contacts 404 such as one or more input/output pins, and the support 102. The over-mold 430 may substantially surround the one or more semiconductor devices 400 and/or the IPD component 200, which are mounted on the support 102 using a die attach material. The over-mold 430 may be formed of a plastic or a plastic polymer compound, which may be injection molded around the support 102, the one or more semiconductor devices 400 and/or the IPD component 200, and/or the like, thereby providing protection from the outside environment. The one or more semiconductor devices 400, the IPD component 200 may be coupled to the one or more metal contacts 404 via the one or more interconnects 104.

The one or more interconnects 104 may connect to a plurality of interconnect pads of the components of the package 100. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

In one aspect, the over-mold configuration may substantially surround the one or more semiconductor devices 400, the IPD component 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the IPD component 200, and/or the like, thereby providing protection for the IPD component 200, the one or more semiconductor devices 400, and other components of the package 100 from the outside environment.

The package 100 may be implemented as an RF package and the IPD component 200 may be implemented as a radio frequency device that may include, connect, support, or the like a transmitter, transmitter functions, a receiver, receiver functions, a transceiver, transceiver functions, matching network functions, harmonic termination circuitry, integrated passive devices (IPD), and the like. The IPD component 200 implemented as a radio frequency device may be configured to, may support, or the like transmitting a radio wave and modulating that wave to carry data with allowable transmitter power output, harmonics, and/or band edge requirements. The IPD component 200 may be implemented as a radio frequency device may be configured to, may support, or the like receiving a radio wave and demodulating the radio wave. The IPD component 200 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

FIG. 5 illustrates a partial top view of the package according to a particular aspect of the disclosure.

In particular, FIG. 5 shows another exemplary implementation of the package 100 that may include any one or more other features, components, arrangements, and the like as described herein. Referring to FIG. 5, the package 100 may include a plurality of the one or more semiconductor devices 400 and/or a plurality of the IPD component 200. In particular, the arrangement of the plurality of the one or more semiconductor devices 400 and/or the plurality of the IPD component 200 is merely exemplary. In aspects, the package 100 may include any number of the one or more semiconductor devices 400 and any number of the IPD component 200. In one aspect, the IPD component 200 may be configured to attach to the support 102. In one aspect, the IPD component 200 may be configured to directly attach to the support 102.

In one aspect, the IPD component 200 may configured with an interstage matching implementation 300. In one aspect, the IPD component 200 may be configured with an output prematching implementation 500. In one aspect, the IPD component 200 may be configured with an input prematching implementation 900. However, the IPD component 200 may be implemented for other functionality.

The package 100 may further include one or more feed network components that may include one or more input splitting nodes that may be connected to one or more input bond pads by one or more transmission lines. The package 100 may further include one or more output IPD components that may be connected to one or more output bond pads by one or more transmission lines. In aspects, the output IPD components may be implemented with a ceramic substrate.

Figure 6:
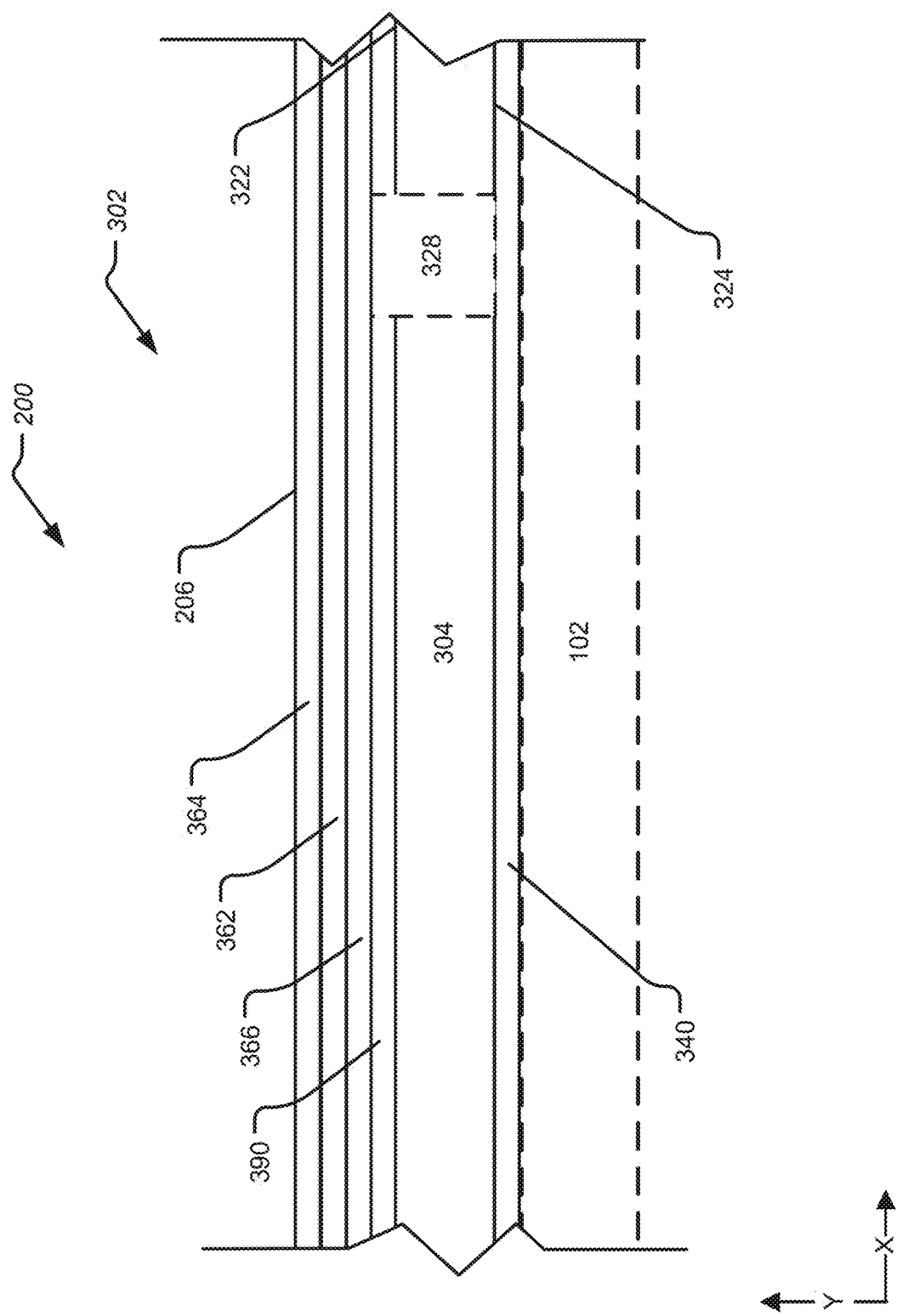
FIG. 6 illustrates a partial side view of an IPD component according to the disclosure.

FIG. 6 illustrates a partial side view of an IPD component according to the disclosure.

In particular, FIG. 6 illustrates exemplary implementations of the IPD component 200 that may include any one or more other features, components, arrangements, and the like as described herein. The IPD component 200 may include a substrate 304, a dielectric layer 362, a top metal 364, a bottom metal 366, a backside metal, and/or the like. Additionally, the IPD component 200 may include an electrical connection such as vias 328. However, any type of electrical connection is contemplated. In some aspects, the IPD component 200 may include an intervening layer 390. In some aspects, the IPD component 200 may be implemented without the intervening layer 390.

The IPD component 200 may be configured as the output prematching implementation 500. In aspects, the IPD component 200 configured as the interstage matching implementation 300 may be placed in between a driver implementation of the one or more semiconductor devices 400 and a final stage die implementation of the one or more semiconductor devices 400. In aspects, the IPD component 200 configured as the input prematching implementation 900 that may transform an input impedance of the final stage die implementation of the one or more semiconductor devices 400 to a target impedance for the driver die implementation of the one or more semiconductor devices 400.

In particular aspects, there may be one or more intervening layers between the substrate 304, the dielectric layer 362, the top metal 364, the bottom metal 366, and/or the backside metal. As further described herein, the top metal 364, the bottom metal 366, and/or other metal layers of the IPD component 200 may form one or more of a capacitor 302, a resistor 314, an inductor 306, a trace 308, and/or the like.

The substrate 304 may include SiC and/or may be made of SiC. In some aspects, the substrate 304 may be a semi-insulating SiC substrate, a p-type substrate, an n-type substrate, and/or the like. In some aspects, the substrate 304 may be very lightly doped. In one aspect, the substrate 304 may be formed of SiC selected from the group of 6H, 4H, 15R, 3C SiC, or the like. In one aspect, the substrate 304 may be formed of SiC that may be semi-insulating and doped with vanadium or any other suitable dopant or undoped of high purity with defects providing the semi-insulating properties. In other aspects, the substrate 304 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. The substrate 304 may include an upper surface 322. The upper surface 322 may support the bottom metal 366 and/or the intervening layer 390.

In particular aspects, the substrate 304 of may include the vias 328 extending along the y-axis through the substrate 304. One or more of the vias 328 may be electrically connected to the backside metal. Additionally, one or more of the vias 328 may be electrically connected to the bottom metal 366 and/or the top metal 364.

The bottom metal 366 may be arranged on the upper surface 322 of the substrate 304 and/or the intervening layer 390. In particular, there may be one or more intervening layers or structures between the upper surface 322 of the substrate 304 and the bottom metal 366 (not shown). The bottom metal 366 may be formed as a metal surface on the upper surface 322 of the substrate 304 and/or the intervening layer 390 and may comprise a metallic material such as copper, gold, nickel, palladium, silver, tin, a gold tin alloy, and the like, and combinations thereof. In one aspect, the bottom metal 366 may have a thickness along the y-axis of 1 micron to 9 microns, 1 micron to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The dielectric layer 362 may be arranged on the bottom metal 366 and/or the substrate 304. In particular, there may be one or more intervening layers or structures between the dielectric layer 362 and the bottom metal 366 (not shown). In other aspects, the dielectric layer 362 may be directly arranged on the bottom metal 366. In one aspect, the dielectric layer 362 may be continuous and/or may be discontinuous. The dielectric layer 362 may include SiN, AlO, SiO, SiO$_2$, AlN, or the like or combinations thereof together with other intervening layers. The dielectric layer 362 may have any thickness along a y-axis to provide the desired capacitance density, capacitance, standoff voltage, and/or the like. In some aspects, the dielectric layer 362 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The top metal 364 may be arranged on the dielectric layer 362. In particular, there may be one or more intervening layers or structures between the top metal 364 and the dielectric layer 362 (not shown). In other aspects, the top metal 364 may be directly arranged on the dielectric layer 362. The top metal 364 may be formed as a metal surface on an upper surface the dielectric layer 362 and may comprise a metallic material such as copper, gold, nickel, palladium, silver, tin, a gold tin alloy, and the like, and combinations thereof. In some aspects, the top metal 364 may comprise stacked layers. In one aspect, the top metal 364 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The substrate 304 may include a lower surface 324. The backside metal may be located on the lower surface 324 of the substrate 304 opposite the upper surface 322. The backside metal may be located in a plane generally parallel to the x-axis or a plane generally parallel to the upper surface 322. The backside metal may comprise a metallic material such as copper, gold, nickel, palladium, silver, tin, a gold tin alloy, and the like, and combinations thereof. In one aspect, the backside metal may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

The vias 328 may be metallic plated holes or metallic filled holes that may function as electrical tunnels through the substrate 304. The vias 328 may comprise a metallic material such as copper, gold, nickel, palladium, silver, tin, a gold tin alloy, and the like, and combinations thereof. The vias 328 may have an axis that may be located in a plane generally perpendicular to the x-axis, a plane generally parallel to the x-axis, and/or a plane generally perpendicular to the upper surface 322.

An upper surface 322 of the top metal 364 may form and/or may support a plurality of interconnect pads 206. The plurality of interconnect pads 206 may include multiple bond pad areas. In other aspects, the plurality of interconnect pads 206 may be formed by a single bar structure that may be continuous. The plurality of interconnect pads 206 may be formed by a metal surface on the dielectric layer 362 and/or the top metal 364 and may comprise a metallic material such as copper, gold, nickel, palladium, silver, and the like, and combinations thereof.

In one aspect, the intervening layer 390 may be formed of different suitable materials such as a Group III-nitride such as $Al_xGa_yIn_{(1-x-y)}N$ (where 0<=x<=1, 0<=y<=1, x+y<=1), e.g., GaN, AlGaN, AlN, and the like, or another suitable material. In one aspect, the intervening layer 390 is formed of GaN. In one aspect, the intervening layer 390 is directly on the substrate 304. In some aspects, the intervening layer 390 may be formed directly on a nucleation layer or on the nucleation layer with intervening layer(s). In one aspect, the intervening layer 390 may be high purity GaN. In one aspect, the intervening layer 390 may be high purity GaN that may be a low-doped n-type.

In particular, as illustrated in FIG. 6 portions of the IPD component 200 may form a capacitor 302 with the top metal 364 and the bottom metal 366 having the dielectric layer 362 therebetween. The bottom metal 366 may be connected to the vias 328. The top metal 364 may be arranged parallel to the x-axis as illustrated, the top metal 364 may be discontinuous and arranged parallel the bottom metal 366. Moreover, the top metal 364 may be arranged at least partially vertically above the bottom metal 366 along the y-axis as illustrated. The top metal 364 may be formed as a metal surface and may comprise a metallic material such as copper, gold, nickel, palladium, silver, tin, a gold tin alloy, and the like, and combinations thereof. In one aspect, the bottom metal 366 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The capacitance of the capacitor 302 may then be defined by the area of the bottom metal 366, the top metal 364, and the thickness and dielectric constant of the dielectric layer 362, and may have an independent and isolated region on a backside of the substrate 304 for electrical connection by the backside metal. The dielectric layer 362 may have any thickness along a y-axis to provide the desired capacitance density, capacitance, standoff voltage, and/or the like.

Figure 7:
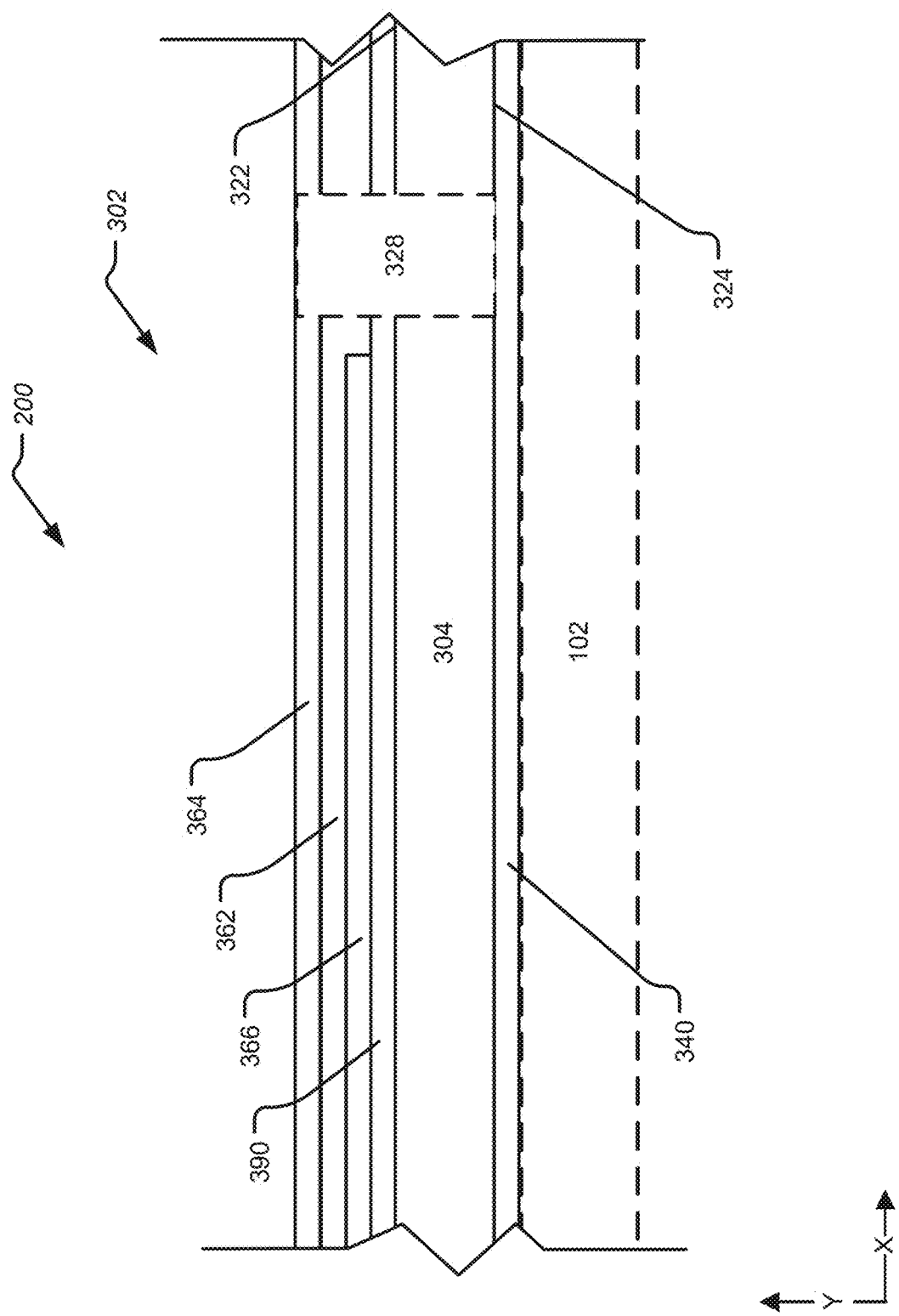
FIG. 7 illustrates a partial side view of an IPD component according to the disclosure.

FIG. 7 illustrates a partial side view of an IPD component according to the disclosure.

In particular, FIG. 7 illustrates exemplary implementations of the IPD component 200 that may include any one or more other features, components, arrangements, and the like as described herein. In particular, as illustrated in FIG. 7 portions of the IPD component 200 may form a capacitor 302 with the top metal 364 and the bottom metal 366 having the dielectric layer 362 therebetween. The top metal 364 may be connected to the vias 328. The top metal 364 may be arranged parallel to the x-axis as illustrated, the top metal 364 may be discontinuous and arranged parallel the bottom metal 366. Moreover, the top metal 364 may be arranged at least partially vertically above the bottom metal 366 along the y-axis as illustrated.

The capacitance of the capacitor 302 may then be defined by the area of the bottom metal 366, the top metal 364, and the thickness and dielectric constant of the dielectric layer 362, and may have an independent and isolated region on a backside of the substrate 304 for electrical connection by the backside metal.

Figure 8:
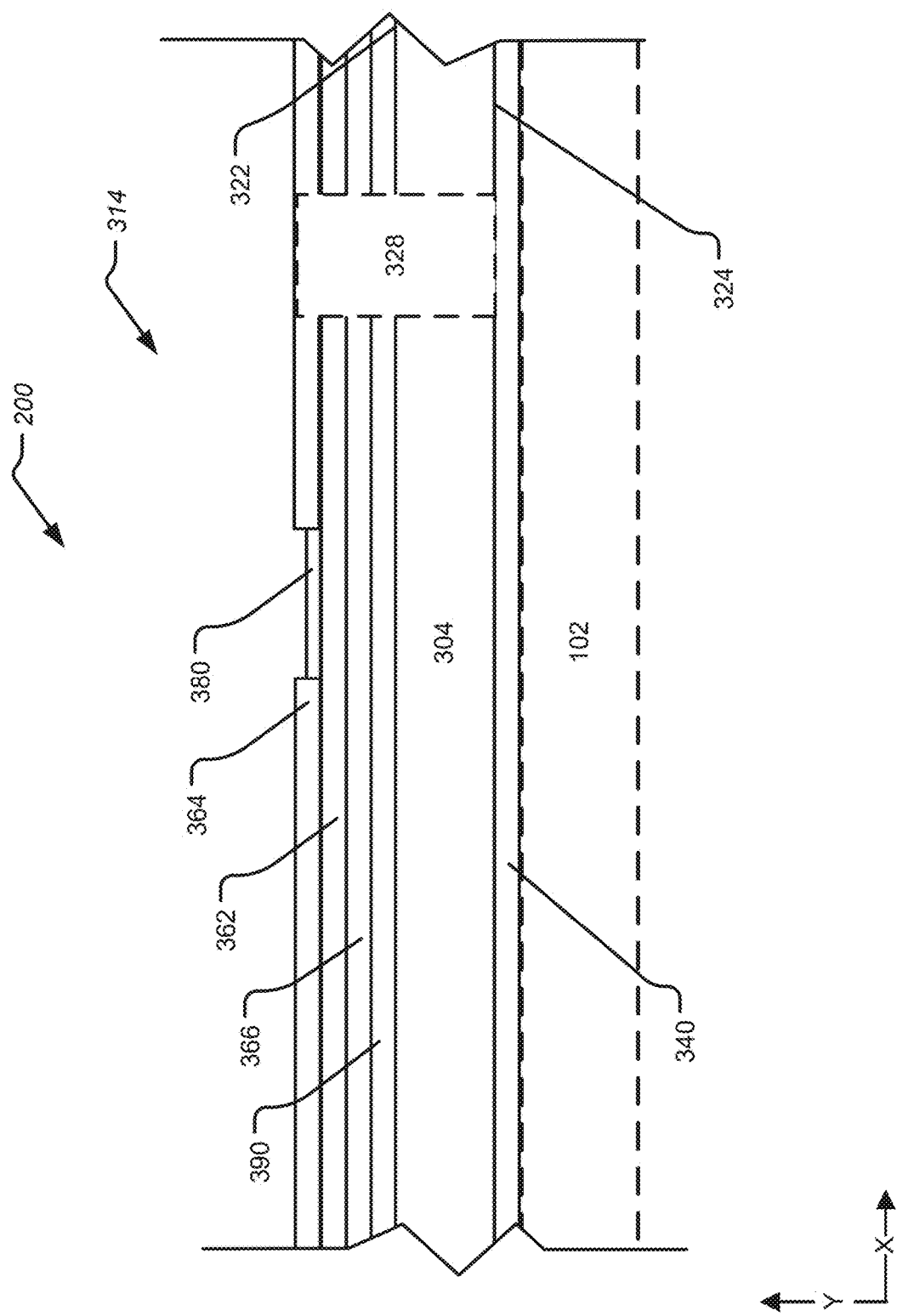
FIG. 8 illustrates another partial side view of an IPD component according to the disclosure.

FIG. 8 illustrates another partial side view of an IPD component according to the disclosure.

In particular, FIG. 8 illustrates exemplary implementations of the IPD component 200 that may include any one or more other features, components, arrangements, and the like as described herein. In particular, as illustrated in FIG. 8 the IPD component 200 may further include an additional metal portion 380. The additional metal portion 380 may extend between a discontinuous portion of the bottom metal 366. Alternatively, the additional metal portion 380 may extend between a discontinuous portion of the top metal 364 (not shown).

Accordingly, the IPD component 200 together with the additional metal portion 380 may form the resistor 314. The resistance of the resistor 314 may be defined by the width, length, and/or height of the additional metal portion 380. However, the resistor 314 may additionally or alternatively be implemented as a thin film resistor, a thick film resistor, a printed thin film resistor, a printed thick film resistor, and/or the like.

Figure 9:
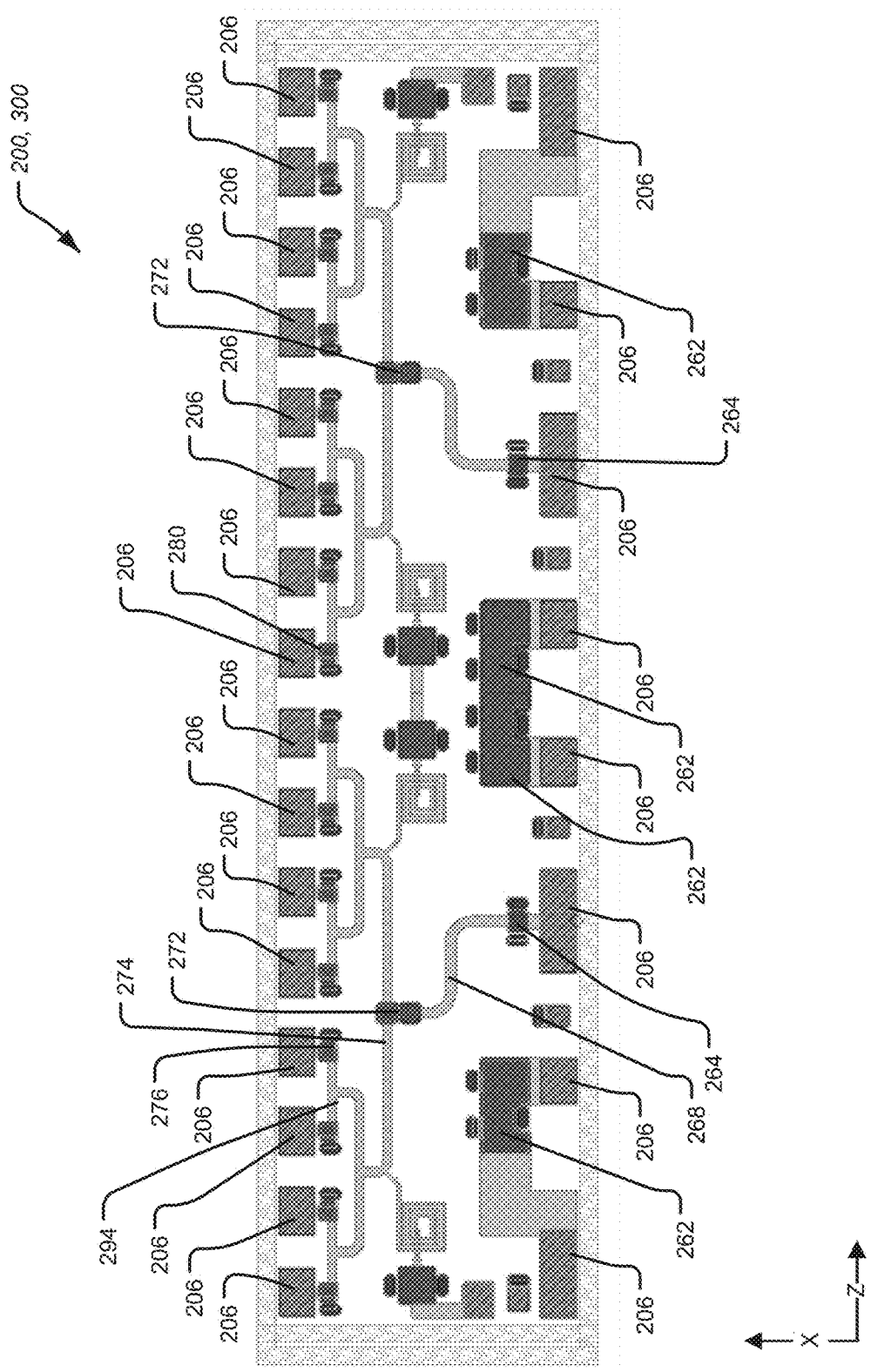
FIG. 9 illustrates a top view of IPD components according to the disclosure.

FIG. 9 illustrates a top view of IPD components according to the disclosure.

Figure 10:
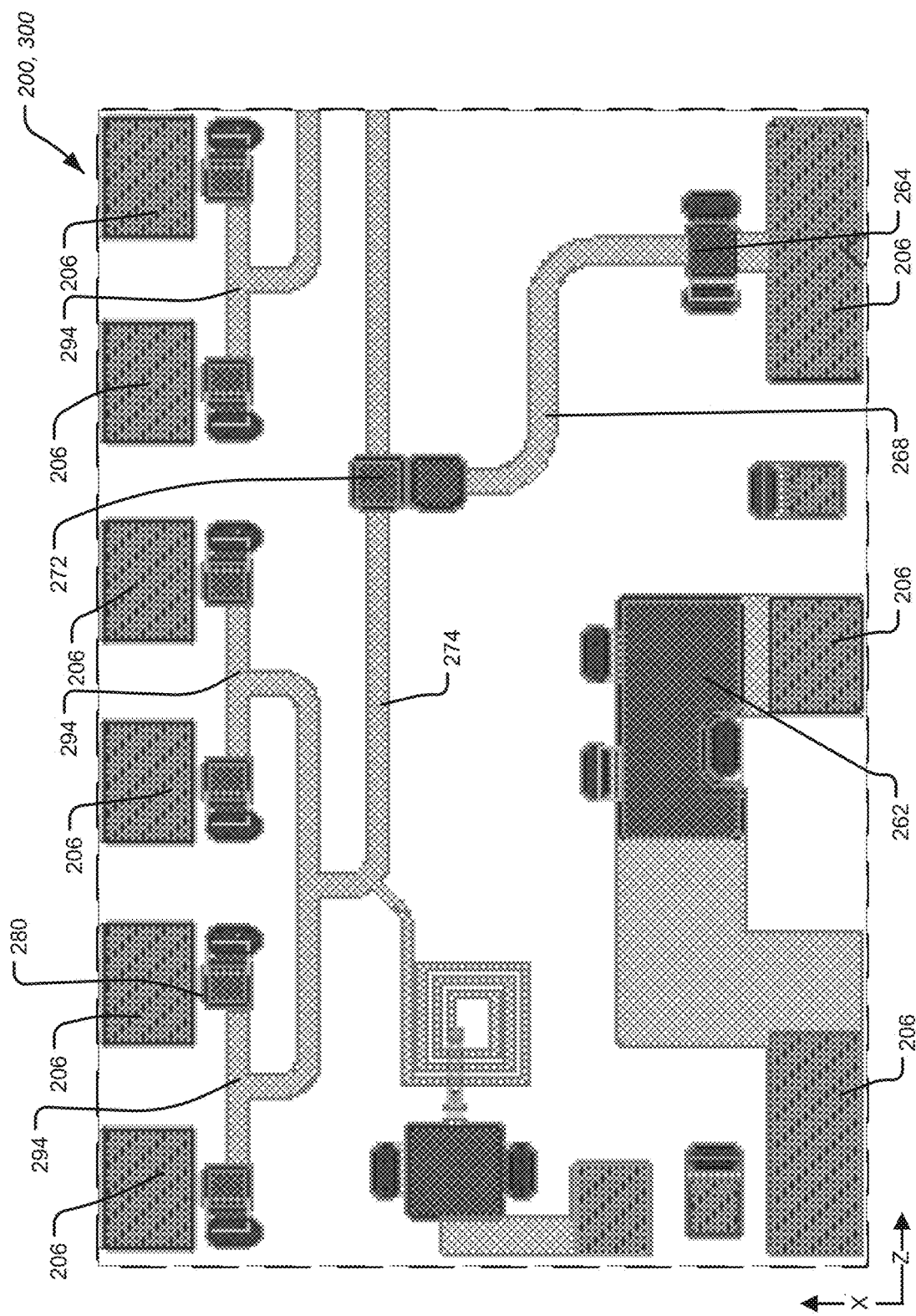
FIG. 10 illustrates a partial top view of the IPD components according to FIG. 9.

FIG. 10 illustrates a partial top view of the IPD components according to FIG. 9.

Figure 11:
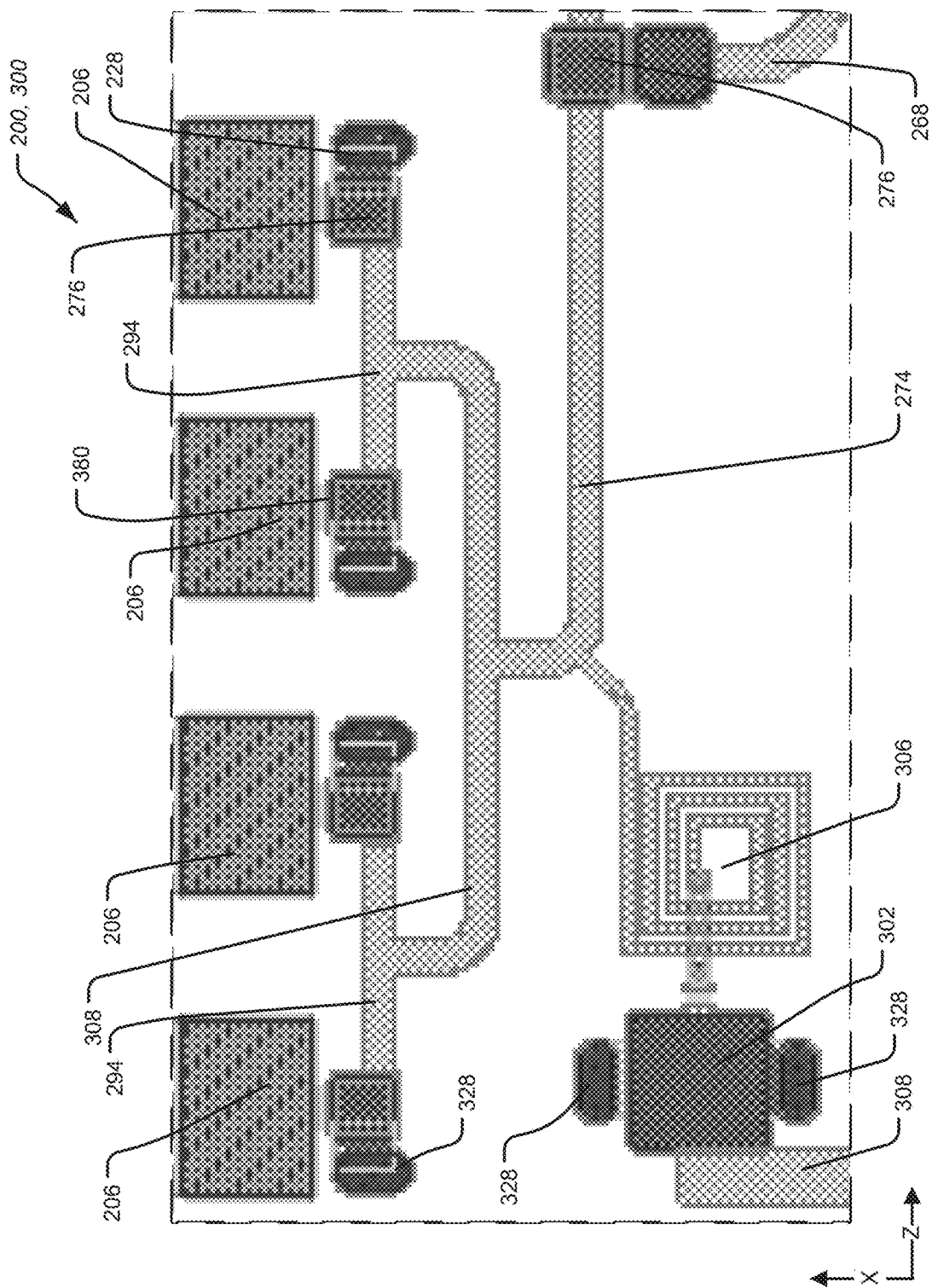
FIG. 11 illustrates a partial top view of the IPD components according to FIG. 9.

FIG. 11 illustrates a partial top view of the IPD components according to FIG. 9.

Figure 12:
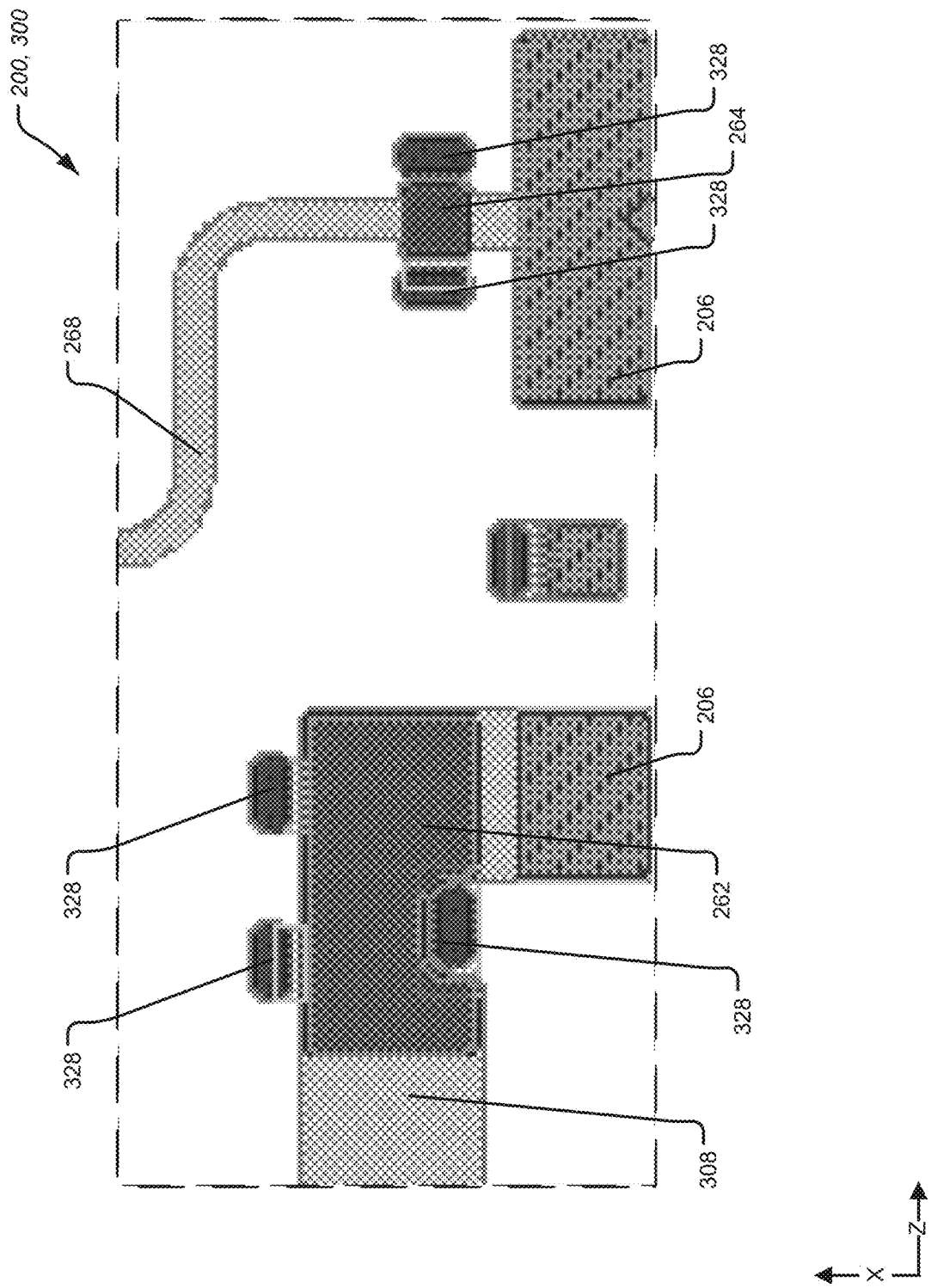
FIG. 12 illustrates a partial top view of the IPD components according to FIG. 9.

FIG. 12 illustrates a partial top view of the IPD components according to FIG. 9.

Figure 13:
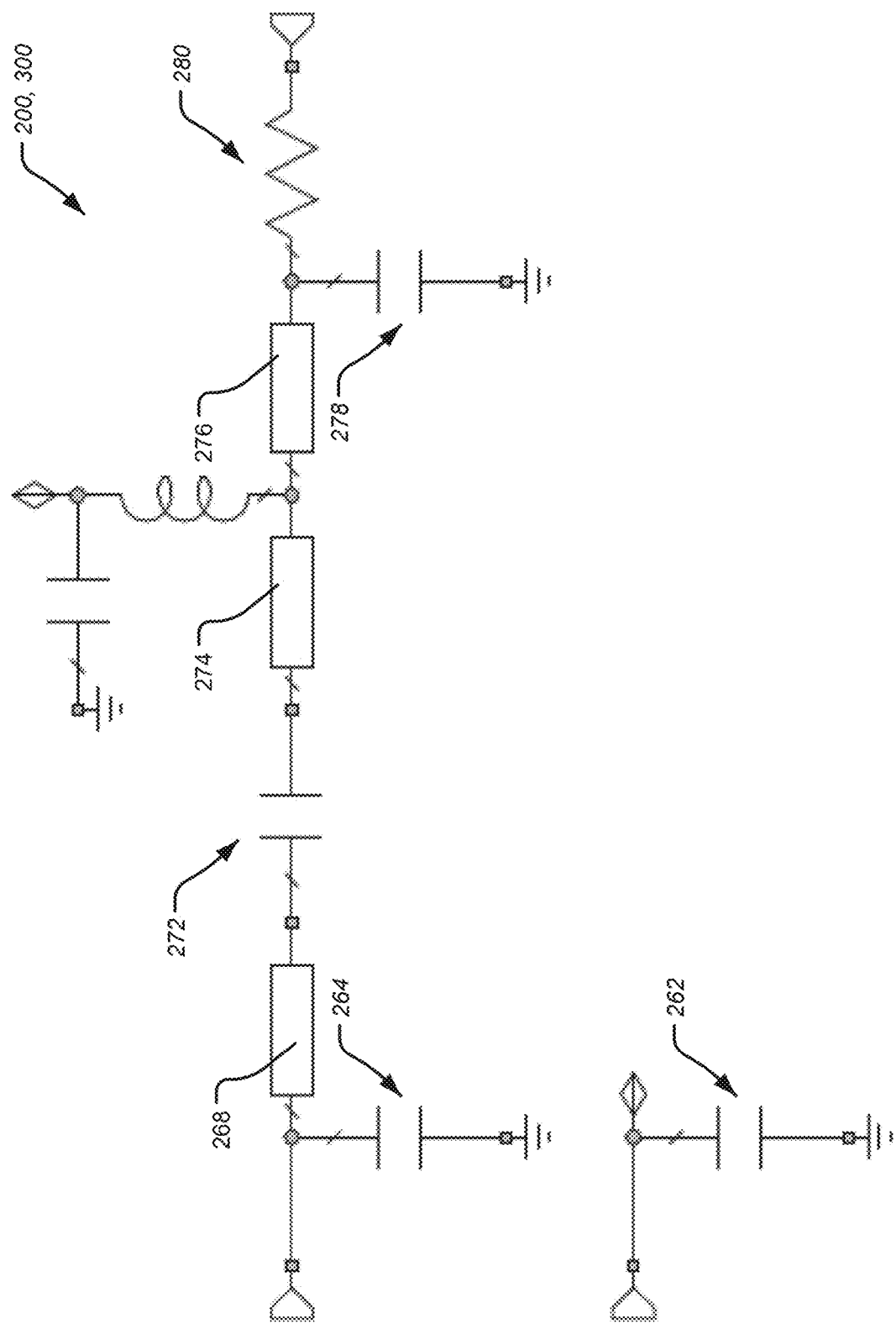
FIG. 13 illustrates an equivalent circuit schematic of the IPD components according to FIG. 9.

FIG. 13 illustrates an equivalent circuit schematic of the IPD components according to FIG. 9.

In particular, FIG. 9, FIG. 10, FIG. 11, FIG. 12, and FIG. 13 illustrate an exemplary implementation of the IPD component 200 that may include any one or more other features, components, arrangements, and the like as described herein. As illustrated in FIG. 9, FIG. 10, FIG. 11, FIG. 12, and FIG. 13, the IPD component 200 may be implemented as the interstage matching implementation 300. The IPD component 200 may include a plurality of interconnect pads 206, a first capacitor component 262, a second capacitor component 264, a first transmission line 268, a third capacitor component 276, a fourth capacitor component 272, a second transmission line 274, a third transmission line 294, a resistor component 280, and/or the like.

In aspects, the plurality of interconnect pads 206 may be configured as an interconnect bond pad. In aspects, the plurality of interconnect pads 206 may be implemented as a metallic layer. In aspects, the plurality of interconnect pads 206 may be arranged on the top metal 364, the dielectric layer 362, the bottom metal 366, and/or the intervening layer 390. In aspects, the plurality of interconnect pads 206 may be formed by the top metal 364 and/or the bottom metal 366.

In aspects, the first capacitor component 262 may be an implementation of the capacitor 302 and have a construction consistent with FIG. 6 and/or FIG. 7. In one aspect, the first capacitor component 262 may have a capacitor top plate implemented by the top metal 364 or another metallic layer, a capacitor bottom plate implemented by the bottom metal 366 or another metallic layer, and the dielectric layer 362 or another dielectric layer arranged between the top metal 364 and the bottom metal 366. The vias 328 may connect the backside metal with the top metal 364, the bottom metal 366, and/or another metallic layer. In aspects, the first capacitor component 262 may be implemented as a first matching capacitor.

In aspects, the second capacitor component 264 may be an implementation of the capacitor 302 and have a construction consistent with FIG. 6 and/or FIG. 7. In one aspect, the second capacitor component 264 may have a capacitor top plate implemented by the top metal 364 or another metallic layer, a capacitor bottom plate implemented by the bottom metal 366 or another metallic layer, and the dielectric layer 362 or another dielectric layer may be arranged between the top metal 364 and the bottom metal 366. The vias 328 may connect the backside metal with the top metal 364, the bottom metal 366, and/or another metallic layer. In aspects, the second capacitor component 264 may be implemented as a second matching capacitor.

In aspects, the third capacitor component 276 may be an implementation of the capacitor 302 and have a construction consistent with FIG. 6 and/or FIG. 7. In one aspect, the third capacitor component 276 may have a capacitor top plate implemented by the top metal 364 or another metallic layer, a capacitor bottom plate implemented by the bottom metal 366 or another metallic layer, and the dielectric layer 362 or another dielectric layer may be arranged between the top metal 364 and the bottom metal 366. The vias 328 may connect the backside metal with the top metal 364, the bottom metal 366, and/or another metallic layer. In aspects, the third capacitor component 276 may be implemented as a third matching capacitor.

In aspects, the fourth capacitor component 272 may be an implementation of the capacitor 302 and have a construction consistent with FIG. 6 and/or FIG. 7. In one aspect, the fourth capacitor component 272 may have a capacitor top plate implemented by the top metal 364 or another metallic layer, a capacitor bottom plate implemented by the bottom metal 366 or another metallic layer, and the dielectric layer 362 or another dielectric layer may be arranged between the top metal 364 and the bottom metal 366. The vias 328 may connect the backside metal with the top metal 364, the bottom metal 366, and/or another metallic layer. In aspects, the fourth capacitor component 272 may be implemented as a blocking capacitor. In aspects, the fourth capacitor component 272 may be implemented as a series blocking capacitor.

In aspects, the resistor component 280 may be an implementation of the resistor 314 and have a construction consistent with FIG. 8. In one aspect, the resistor component 280 may include the additional metal portion 380 connected to the top metal 364, the bottom metal 366, and/or another metallic layer. In aspects, the resistor component 280 may be implemented as a stabilization resistor.

In aspects, the third capacitor component 276 may be an implementation of the capacitor 302 and have a construction consistent with FIG. 6 and/or FIG. 7. In one aspect, the third capacitor component 276 may have a capacitor top plate implemented by the top metal 364 or another metallic layer, a capacitor bottom plate implemented by the bottom metal 366 or another metallic layer, and the dielectric layer 362 or another dielectric layer may be arranged between the top metal 364 and the bottom metal 366. The vias 328 may connect the backside metal with the top metal 364, the bottom metal 366, and/or another metallic layer. In aspects, the third capacitor component 276 may be a series of two or more capacitors.

As illustrated in FIG. 11, one or more implementations of the plurality of interconnect pads 206 may connect to one of more implementations the additional metal portion 380 that may form the resistor 314. Additionally, one or more implementations of the additional metal portion 380 may connect to one of more implementations the third capacitor component 276. Further, one or more implementations of the third capacitor component 276 may connect to one of more implementations the vias 328 and the third transmission line 294.

Additionally, one or more implementations of the third transmission line 294 may connect to the second transmission line 274; and one or more implementations of the second transmission line 274 may connect to the fourth capacitor component 272. The second transmission line 274 may further connect to an implementation of the inductor 306 and the inductor 306 may connect to an implementation of the capacitor 302 that includes one or more implementations of the vias 328. Additionally, this implementation of the capacitor 302 may connect to an implementation of the trace 308.

The inductor 306 may be implemented as a spiral. The spiral construction of the inductor 306 may be formed from the top metal 364, the bottom metal 366, and/or another metallic layer. Accordingly, the construction of the inductor 306 may connect to the second transmission line 274 and/or the implementation of the capacitor 302. Additionally, the second transmission line 274 may connect to the fourth capacitor component 272 and the fourth capacitor component 272 may connect to the first transmission line 268.

With reference to FIG. 12, the first transmission line 268 may connect to the second capacitor component 264. The second capacitor component 264 may connect to one or more implementations of the vias 328. Additionally, the second capacitor component 264 may connect to the plurality of interconnect pads 206. With further reference to FIG. 12, the first capacitor component 262 may connect to the plurality of interconnect pads 206 through a metallic layer such as the trace 308. The first capacitor component 262 may connect to one or more implementations of the vias 328. Additionally, the first capacitor component 262 may connect to the metallic layer such as the trace 308.

Figure 14:
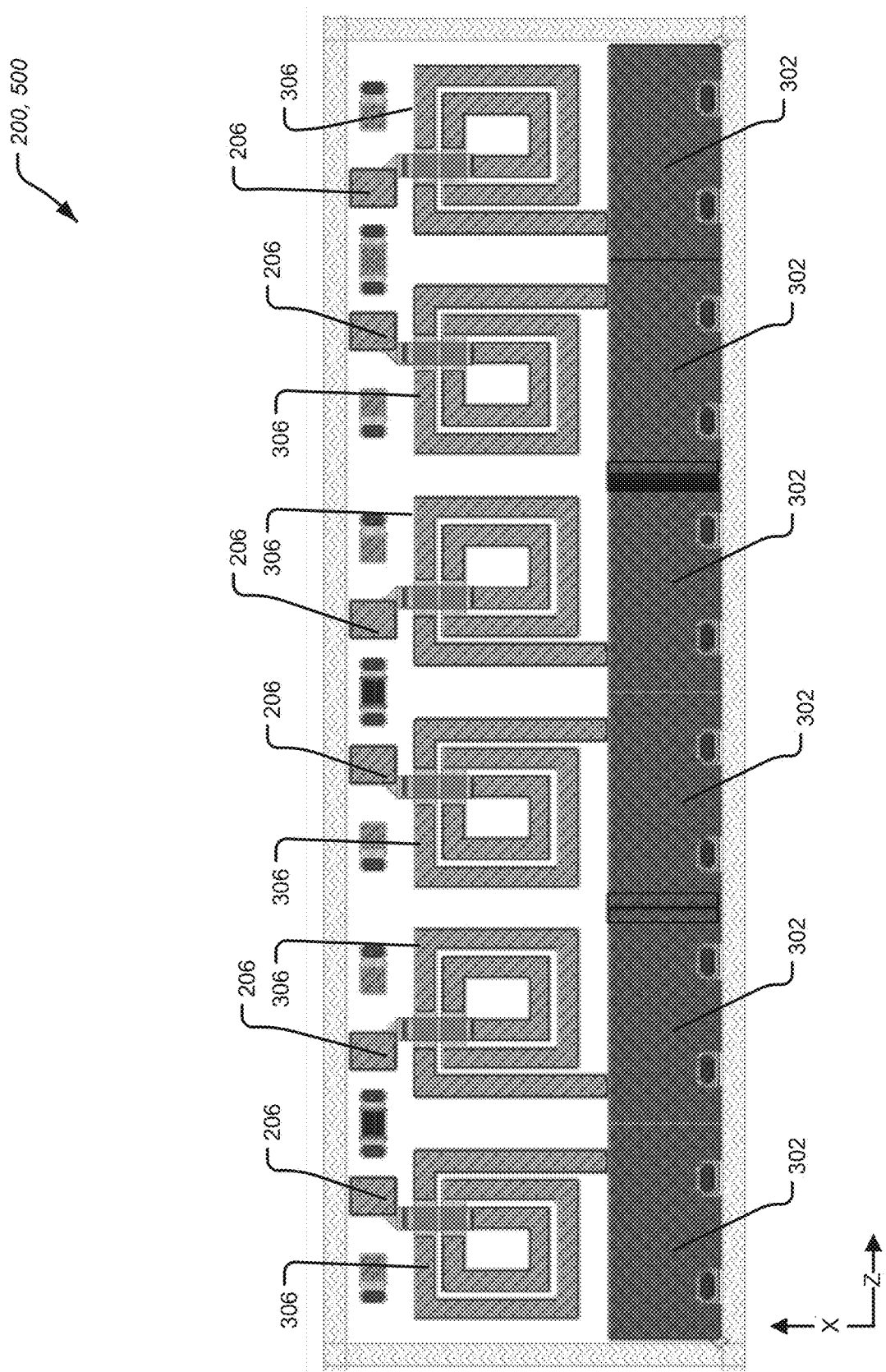
FIG. 14 illustrates a top view of IPD components according to the disclosure.

FIG. 14 illustrates a top view of IPD components according to the disclosure.

Figure 15:
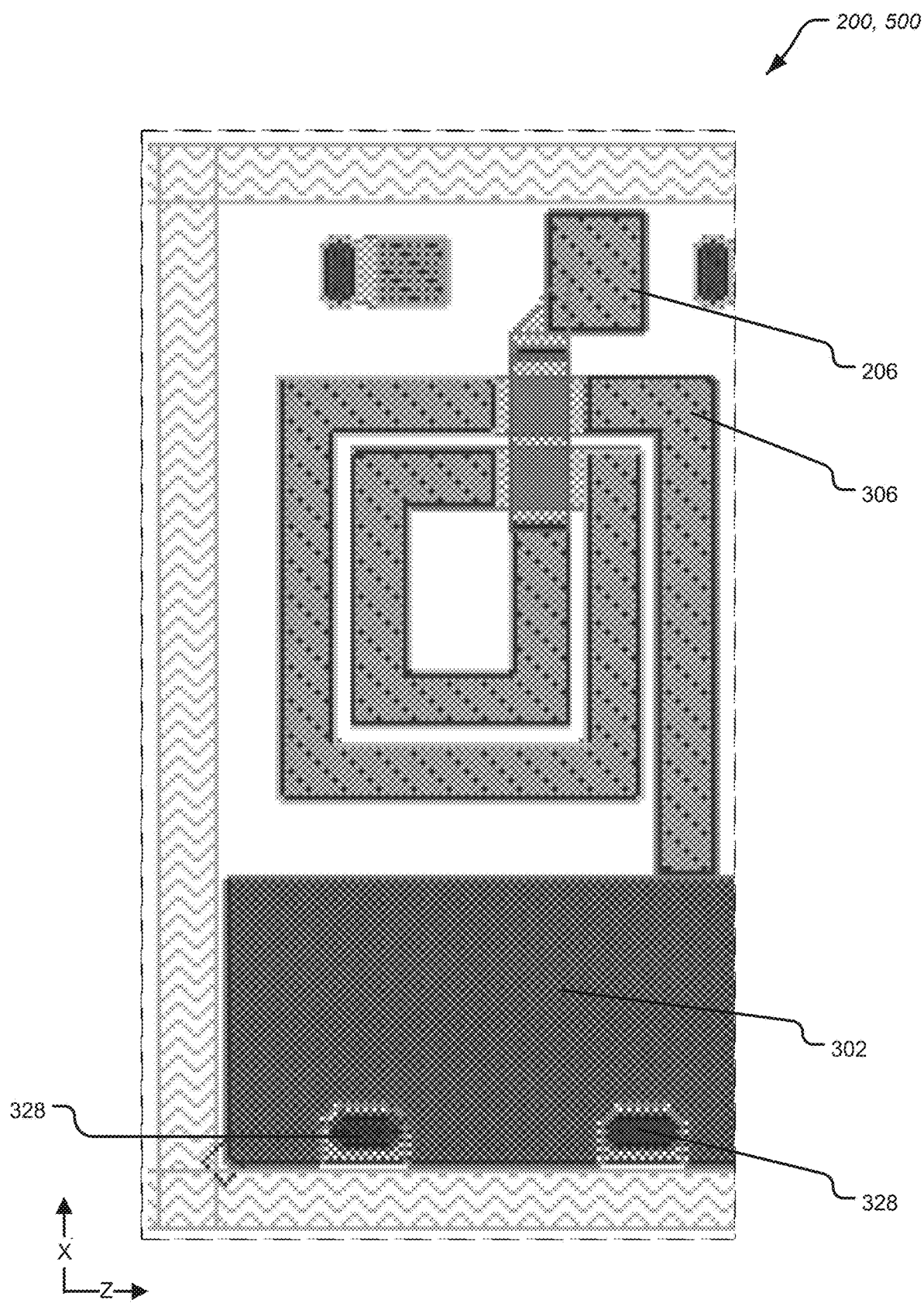
FIG. 15 illustrates a partial top view of the IPD components according to FIG. 14.

FIG. 15 illustrates a partial top view of the IPD components according to FIG. 14.

In particular, FIG. 14 and FIG. 15 illustrate an exemplary implementation of the IPD component 200 that may include any one or more other features, components, arrangements, and the like as described herein. As illustrated in FIG. 14 and FIG. 15, the IPD component 200 may be implemented as the output prematching implementation 500. In aspects, the IPD component 200 implemented as the output prematching implementation 500 may include a plurality of the plurality of interconnect pads 206, the inductor 306, and the capacitor 302. In some aspects, the IPD component 200 may be implemented as the output prematching implementation 500 and may be used to provide a shunt LC match at output of transistor.

With reference to FIG. 15, the IPD component 200 implemented as the output prematching implementation 500 may include a plurality of the plurality of interconnect pads 206 that may each connect to one of the plurality of the inductor 306. Each of the plurality of the inductor 306 may connect to the capacitor 302. In aspects, the capacitor 302 may include one or more implementations of the vias 328.

Figure 16:
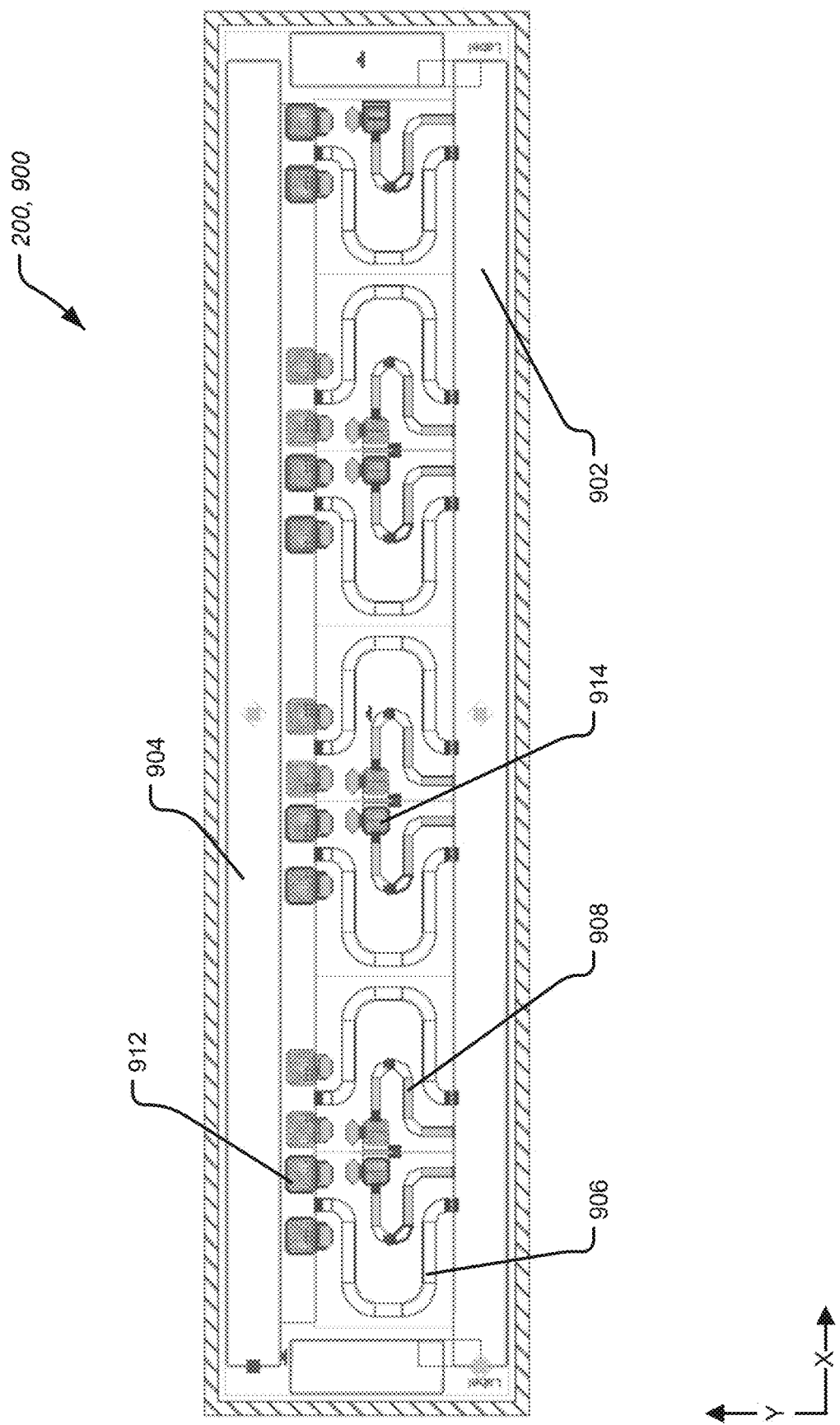
FIG. 16 illustrates a top view of IPD components according to the disclosure.

FIG. 16 illustrates a top view of IPD components according to the disclosure.

Figure 17:
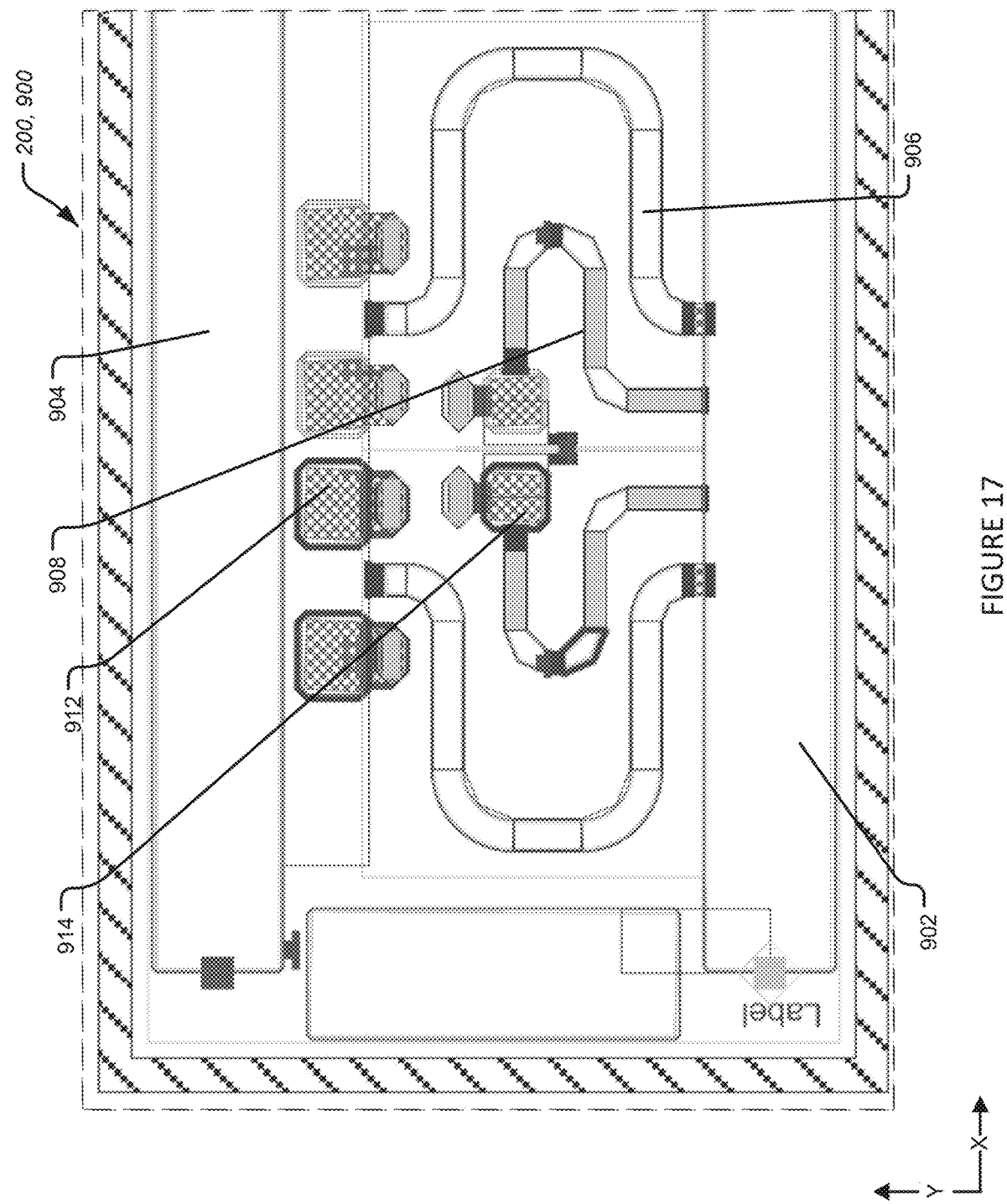
FIG. 17 illustrates a partial top view of the IPD components according to FIG. 16.

FIG. 17 illustrates a partial top view of the IPD components according to FIG. 16.

Figure 18:
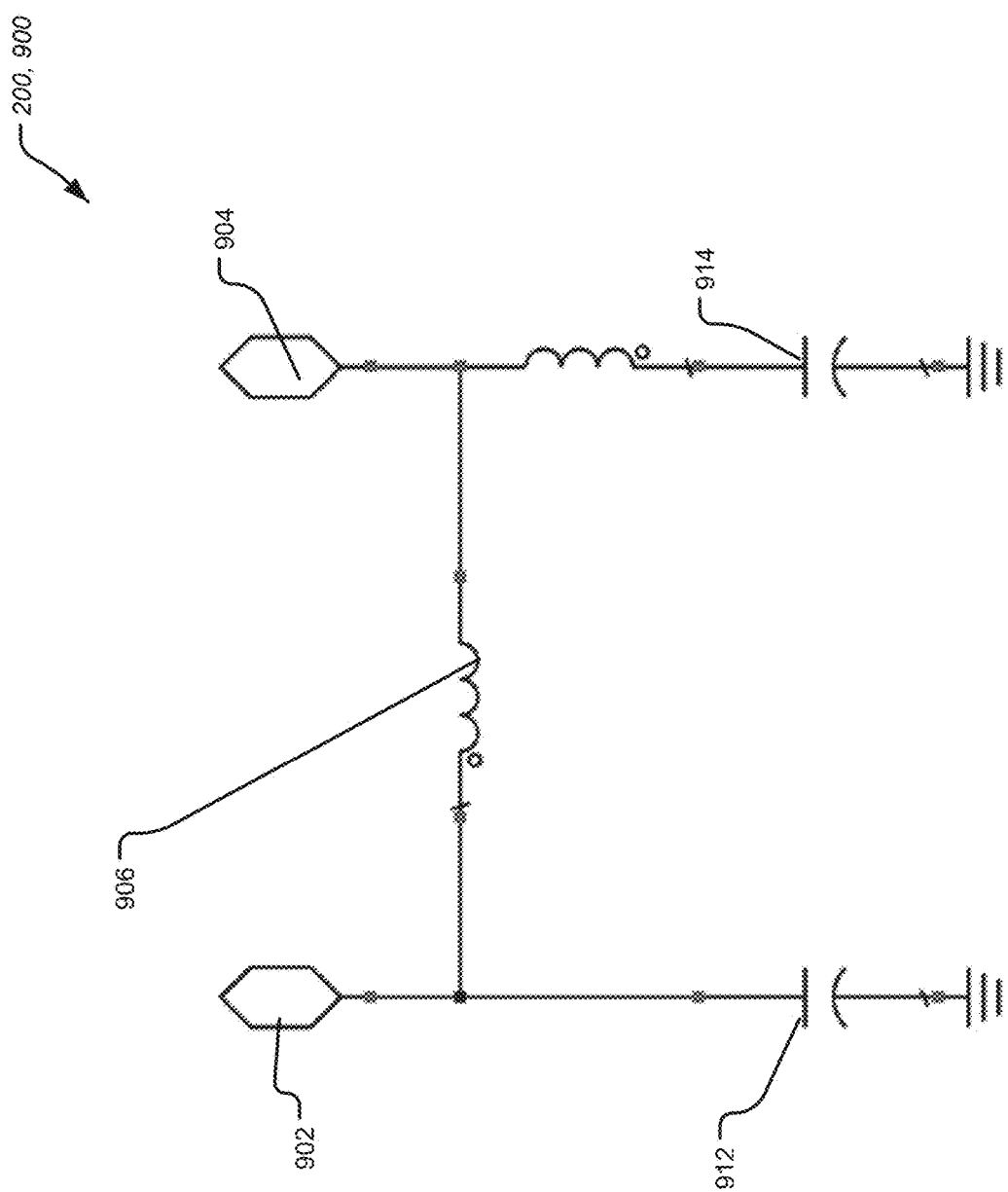
FIG. 18 illustrates an equivalent circuit schematic of the IPD components according to FIG. 16.

FIG. 18 illustrates an equivalent circuit schematic of the IPD components according to FIG. 16.

In particular, FIG. 16, FIG. 17, and FIG. 18 illustrate an exemplary implementation of the IPD component 200 that may include any one or more other features, components, arrangements, and the like as described herein. As illustrated in FIG. 14 and FIG. 15, the IPD component 200 may be implemented as the input prematching implementation 900. In aspects, the IPD component 200 implemented as the input prematching implementation 900 may include a first bond pad 902, a second bond pad 904, a first inductive element 906, a second inductive element 908, a first capacitive element 912, a second capacitive element 914, and/or the like. In aspects, the IPD component 200 implemented as the input prematching implementation 900 may provide optimum matching at both fundamental and harmonic frequencies.

In aspects, the IPD component 200 implemented as the input prematching implementation 900 may implement the first inductive element 906 for fundamental frequency match, the second inductive element 908 for harmonic frequency match, the first capacitive element 912 for fundamental frequency match, and the second capacitive element 914 for harmonic frequency match.

In aspects, the first bond pad 902 and/or the second bond pad 904 may be configured as an interconnect bond pad. In aspects, the first bond pad 902 and/or the second bond pad 904 may be implemented as a metallic layer. In aspects, the first bond pad 902 and/or the second bond pad 904 may be arranged on the top metal 364, the dielectric layer 362, the bottom metal 366, and/or the intervening layer 390. In aspects, the first bond pad 902 and/or the second bond pad 904 may be formed by the top metal 364 and/or the bottom metal 366.

The first inductive element 906 and/or the second inductive element 908 may be an implementation of the inductor 306. The first inductive element 906 and/or the second inductive element 908 may be formed from the top metal 364, the bottom metal 366, and/or another metallic layer.

The first capacitive element 912 and/or the second capacitive element 914 may be an implementation of the capacitor 302 and have a construction consistent with FIG. 6 and/or FIG. 7. In one aspect, the first capacitive element 912 and/or the second capacitive element 914 may have a capacitor top plate implemented by the top metal 364 or another metallic layer, a capacitor bottom plate implemented by the bottom metal 366 or another metallic layer, and the dielectric layer 362 or another dielectric layer may be arranged between the top metal 364 and the bottom metal 366. The vias 328 may connect the backside metal with the top metal 364, the bottom metal 366, and/or another metallic layer.

The plurality of interconnect pads 206, the capacitor 302, the inductor 306, the trace 308, the backside metal, the top metal 364, the bottom metal 366, and/or any other metallization layer may be manufactured utilizing one or more manufacturing techniques including print screening or dispensing for solder paste, print screening or dispensing for epoxy, silk screen printing processes, photoengraving processes, print onto transparent film processes, photo mask processes, photo-sensitized board processes, laser resist ablation processes, milling processes, laser etching processes, and/or like processes.

In aspects, RF devices may be configured and implemented in the IPD component 200. In particular, the RF devices may be configured and implemented in the IPD component 200. The RF devices may include matching networks, harmonic termination circuitry, integrated passive devices (IPD), and the like.

Additionally, the IPD component 200 may include a circuit structure. In particular, the circuit structure may be arranged and configured to provide an inductance, capacitance, resistance, and/or the like. In one aspect, the circuit structure may be a metallic surface arranged on the upper surface and together with the metallization layer, may create a capacitor. Additionally, the circuit structure may be configured as inductive strips, inductive coils, capacitive stubs, and/or the like.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The IPD component 200 may be an active device, a passive device, an IPD, a transistor device, or the like. The IPD component 200 may include any electrical component for any application. In this regard, the IPD component 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The IPD component 200 may be implemented as a radio frequency device may be configured to, may support, or the like transmitting a radio wave and modulating that wave to carry data with allowable transmitter power output, harmonics, and/or band edge requirements. The IPD component 200 implemented as a radio frequency device may be configured to, may support, or the like receiving a radio wave and demodulating the radio wave. The IPD component 200 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

Figure 19:
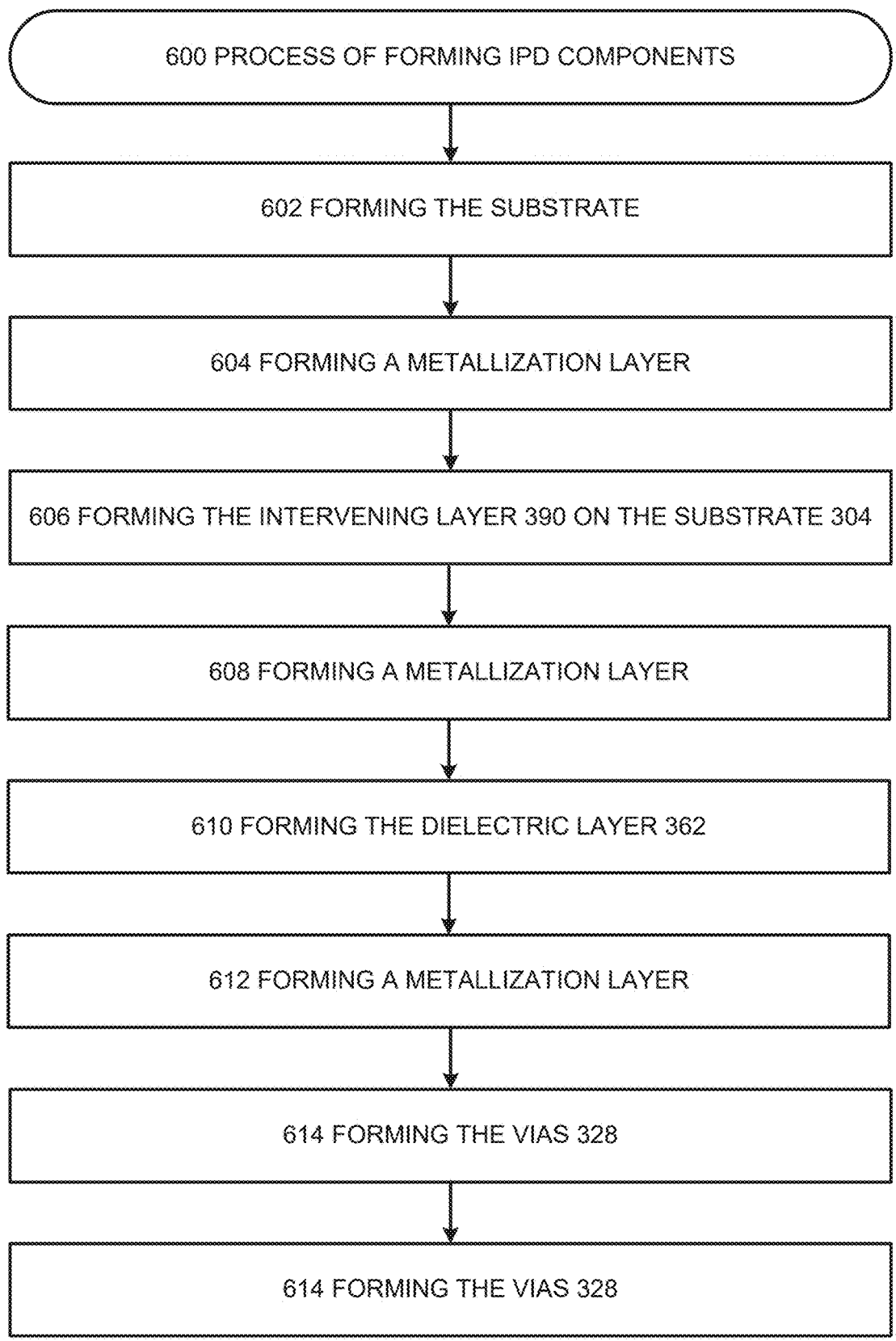
FIG. 19 shows a process of making IPD components according to the disclosure.

FIG. 19 shows a process of making IPD components according to the disclosure.

In particular, FIG. 19 illustrates a process of forming IPD components 600 that relates to the IPD component 200 as described herein. It should be noted that the aspects of the process of forming IPD components 600 may be performed in a different order consistent with the aspects described herein. Additionally, it should be noted that portions of the process of forming IPD components 600 may be performed in a different order consistent with the aspects described herein. Moreover, the process of forming IPD components 600 may be modified to have more or fewer processes consistent with the various aspects disclosed herein. Additionally, the process of forming IPD components 600 may include any other aspects of the disclosure described herein.

Initially, the process of forming IPD components 600 may include a process of forming the substrate 602. More specifically, the substrate 304 may be constructed, configured, and/or arranged as described herein.

Further, the process of forming IPD components 600 may include forming a metallization layer 604. More specifically, the backside metal may be constructed, configured, and/or arranged as described herein on at least a portion of the substrate 304. The process of forming the metallization layer 604 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the intervening layer 390 on the substrate 606. The intervening layer 390 may be grown or deposited on the substrate 304. In one aspect, the intervening layer 390 may be GaN. In another aspect, the intervening layer 390 may be formed with LEO. In one aspect, a nucleation layer may be formed on the substrate 304 and the intervening layer 390 may be formed on the nucleation layer. The intervening layer 390 may be grown or deposited on the nucleation layer.

Further, the process of forming IPD components 600 may include forming a metallization layer 608. More specifically, the bottom metal 366 may be constructed, configured, and/or arranged as described herein on at least a portion of the substrate 304. The process of forming the metallization layer 608 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the dielectric layer 610. More specifically, the dielectric layer 362 may be constructed, configured, and/or arranged as described herein on at least a portion of the substrate 304, the intervening layer 390, the bottom metal 366, and/or the like. The process of forming the dielectric layer 362 may can be deposited using MOCVD, plasma chemical vapor deposition (CVD), hot-filament CVD, or sputtering. In one aspect, the dielectric layer 362 may include deposition. In one aspect, the dielectric layer 362 forms an insulating layer. In one aspect, the dielectric layer 362 forms an insulator.

Further, the process of forming IPD components 600 may include forming a metallization layer 612. More specifically, the top metal 364 may be constructed, configured, and/or arranged as described herein on at least a portion of the dielectric layer 362 and/or the like. The process of forming the metallization layer 612 may include utilizing one or more manufacturing techniques including metal deposition, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming a metallization layer 612 may include forming the interconnect pad. More specifically, the plurality of interconnect pads 206 may be constructed, configured, and/or arranged as described herein on the substrate 304. Additionally, the plurality of interconnect pads 206 may be constructed, configured, and/or arranged as described herein on the substrate 304. The process of forming the interconnect pad may include utilizing one or more manufacturing techniques including deposition, photoengraving processes, print onto transparent film processes, photo mask processes in combination with etching processes, photo-sensitized board processes, laser resist ablation processes, milling processes, laser etching processes, direct metal printing processes, and/or like processes.

Further, the process of forming IPD components 600 may include forming the vias 614. More specifically, the vias 328 may be constructed, configured, and/or arranged as described herein on at least a portion of the substrate 304.

Additionally, the process of forming IPD components 600 may include manufacturing to form the IPD component 200 in a panel, a wafer, and/or the like. The process of forming IPD components 600 may include backside etching and cutting the panel and/or the wafer utilizing cutting equipment such as wafer, circuit board, or package sawing equipment to singulate the IPD component 200 from the panel or the wafer, which may have the advantage that the IPD component 200, and/or may be arranged on dicing tape on a ring frame, which can be directly loaded to the Die Attach equipment for subsequent assembly into package 100.

Figure 20:
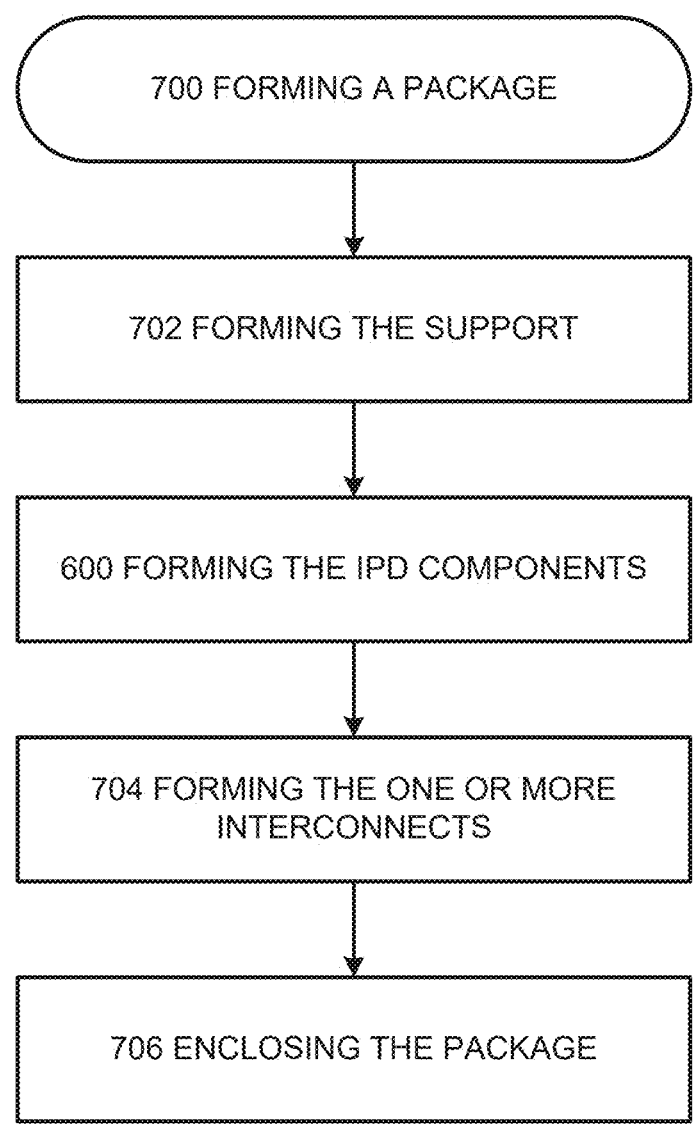
FIG. 20 shows a process of making a package according to the disclosure.

FIG. 20 shows a process of making a package according to the disclosure.

In particular, FIG. 20 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming IPD components 600. More specifically, the IPD component 200 may be constructed, configured, and/or arranged as described herein with reference to FIG. 19 and the associated description thereof. Thereafter, the process of forming IPD components 600 may further include attaching the IPD component 200 to the support 102. In this regard, the IPD component 200 may be mounted on the upper surface of the support 102 and/or the IPD component 200 by an adhesive, soldering, sintering, eutectic bonding, ultrasonically welding, and/or the like as described herein.

The process of forming a package 700 may include a process of forming the one or more interconnects 704. More specifically, the one or more interconnects 104 may be constructed, configured, and/or arranged as described herein. In one aspect, the process of forming the one or more interconnects 704 may include forming the one or more interconnects 104 by forming one or more wires, leads, vias, edge platings, circuit traces, tracks, and/or the like. In one aspect, the process of forming the one or more interconnects 704 may include connecting the one or more interconnects 704 by an adhesive, soldering, sintering, eutectic bonding, ultrasonic welding, a clip component, and/or the like as described herein.

The process of forming a package 700 may include a process of enclosing the package 706. More specifically, the package 100 may be constructed, configured, and/or arranged as described herein. In one aspect, the process of enclosing the package 706 may include forming an open cavity configuration, an over-mold configuration, or the like.

Accordingly, the disclosure has provided a number of different IPD components, a RF product that implements a number of different types of IPD components, and/or the like configured for reduced manufacturing cost, reduced manufacturing complexity, and reduced manufacturing times.

The following are a number of nonlimiting EXAMPLES of aspects of the disclosure. One EXAMPLE includes: EXAMPLE 1. A transistor device includes a metal submount; a transistor die arranged on said metal submount; at least one integrated passive device (IPD) component includes a substrate arranged on said metal submount; and one or more interconnects extending between the transistor die and the at least one integrated passive device (IPD) component, where the substrate includes a silicon carbide (SiC) substrate.

The above-noted EXAMPLE may further include any one or a combination of more than one of the following EXAMPLES: 2. The transistor device according to any EXAMPLE herein where the substrate includes at least one via configured to make an electrical connection to the metal submount. 3. The transistor device according to any EXAMPLE herein where the at least one integrated passive device (IPD) component includes an intervening layer that includes a Group III-nitride. 4. The transistor device according to any EXAMPLE herein where the intervening layer includes Gallium nitride (GaN). 5. The transistor device according to any EXAMPLE herein where the at least one integrated passive device (IPD) component includes a dielectric layer, a top metal, a bottom metal, and a metallization layer. 6. The transistor device according to any EXAMPLE herein where the at least one integrated passive device (IPD) component is configured to form a capacitor with the top metal and the bottom metal having the dielectric layer therebetween. 7. The transistor device according to any EXAMPLE herein where the at least one integrated passive device (IPD) component is configured form an inductor. 8. The transistor device according to any EXAMPLE herein where the inductor is implemented as a spiral shaped structure. 9. The transistor device according to any EXAMPLE herein where the at least one integrated passive device (IPD) component is configured with a plurality of interconnect pads. 10. The transistor device according to any EXAMPLE herein where the at least one integrated passive device (IPD) component includes an interstage matching implementation. 11. The transistor device according to any EXAMPLE herein where the at least one integrated passive device (IPD) component includes an output prematching implementation. 12. The transistor device according to any EXAMPLE herein where the at least one integrated passive device (IPD) component includes an input prematching implementation. 13. The transistor device according to any EXAMPLE herein where the transistor die includes one or multiple LDMOS transistor die. 14. The transistor device according to any EXAMPLE herein where the transistor die includes one or multiple GaN based HEMTs. 15. The transistor device according to any EXAMPLE herein where at least one of the one or multiple GaN based HEMTs includes a silicon carbide substrate. 16. The transistor device according to any EXAMPLE herein where the transistor device includes a plurality of the transistor die. 17. The transistor device according to any EXAMPLE herein where the plurality of the transistor die are configured in a Doherty configuration.

One EXAMPLE includes: EXAMPLE 18. A process for implementing a transistor device includes providing a metal submount; arranging a transistor die on said metal submount; arranging at least one integrated passive device (IPD) component includes a substrate arranged on said metal submount; and connecting one or more interconnects between the transistor die and the at least one integrated passive device (IPD) component, where the substrate includes a silicon carbide (SiC) substrate.

The above-noted EXAMPLE may further include any one or a combination of more than one of the following EXAMPLES: 19. The process for implementing a transistor device according to any EXAMPLE herein includes forming at least one via in the substrate to make an electrical connection to the metal submount. 20. The process for implementing a transistor device according to any EXAMPLE herein where the at least one integrated passive device (IPD) component includes an intervening layer that includes a Group III-nitride. 21. The process for implementing a transistor device according to any EXAMPLE herein where the intervening layer includes Gallium nitride (GaN). 22. The process for implementing a transistor device according to any EXAMPLE herein where the at least one integrated passive device (IPD) component includes a dielectric layer, a top metal, a bottom metal, and a metallization layer. 23. The process for implementing a transistor device according to any EXAMPLE herein where the at least one integrated passive device (IPD) component is configured to form a capacitor with the top metal and the bottom metal having the dielectric layer therebetween. 24. The process for implementing a transistor device according to any EXAMPLE herein where the at least one integrated passive device (IPD) component is configured form an inductor. 25. The process for implementing a transistor device according to any EXAMPLE herein where the inductor is implemented as a spiral shaped structure. 26. The process for implementing a transistor device according to any EXAMPLE herein where the at least one integrated passive device (IPD) component is configured with a plurality of interconnect pads. 27. The process for implementing a transistor device according to any EXAMPLE herein where the at least one integrated passive device (IPD) component includes an interstage matching implementation. 28. The process for implementing a transistor device according to any EXAMPLE herein where the at least one integrated passive device (IPD) component includes an output prematching implementation. 29. The process for implementing a transistor device according to any EXAMPLE herein where the at least one integrated passive device (IPD) component includes an input prematching implementation. 30. The process for implementing a transistor device according to any EXAMPLE herein where the transistor die includes one or multiple LDMOS transistor die. 31. The process for implementing a transistor device according to any EXAMPLE herein where the transistor die includes one or multiple GaN based HEMTs. 32. The transistor device according to any EXAMPLE herein where at least one of the one or multiple GaN based HEMTs includes a silicon carbide substrate. 33. The process for implementing a transistor device according to any EXAMPLE herein where the process for implementing a transistor device includes a plurality of the transistor die. 34. The process for implementing a transistor device according to any EXAMPLE herein where the plurality of the transistor die are configured in a Doherty configuration.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A transistor device, comprising:
   a metal submount;
   a transistor die arranged on said metal submount;
   at least one integrated passive device (IPD) component comprising a substrate arranged on said metal submount; and
   one or more interconnects extending between the transistor die and the at least one integrated passive device (IPD) component,
   wherein the substrate of the at least one integrated passive device (IPD) component comprises a silicon carbide (SiC) substrate.

2. The transistor device according to claim 1 wherein the substrate comprises at least one via configured to make an electrical connection to the metal submount; and wherein the at least one integrated passive device (IPD) component is configured with at least one capacitor, resistor, and/or inductor.

3. The transistor device according to claim 1 wherein the at least one integrated passive device (IPD) component comprises an intervening layer on the substrate of the at least one integrated passive device (IPD) component that comprises a Group III-nitride.

4. The transistor device according to claim 3 wherein the intervening layer comprises Gallium nitride (GaN).

5. The transistor device according to claim 1 wherein the at least one integrated passive device (IPD) component comprises a dielectric layer, a top metal, a bottom metal, and a metallization layer on the substrate of the at least one integrated passive device (IPD) component.

6. The transistor device according to claim 5 wherein the at least one integrated passive device (IPD) component is configured to form a capacitor on the substrate of the at least one integrated passive device (IPD) component with the top metal and the bottom metal having the dielectric layer therebetween.

7. The transistor device according to claim 1 wherein the at least one integrated passive device (IPD) component is configured to form an inductor on the substrate of the at least one integrated passive device (IPD) component.

8. The transistor device according to claim 7 wherein the inductor is implemented as a spiral shaped structure on the substrate of the at least one integrated passive device (IPD) component.

9. The transistor device according to claim 1 wherein the at least one integrated passive device (IPD) component is configured with a plurality of interconnect pads; and wherein the at least one integrated passive device (IPD) component is a passive device.

10. The transistor device according to claim 1 wherein the at least one integrated passive device (IPD) component comprises an interstage matching implementation.

11. The transistor device according to claim 1 wherein the at least one integrated passive device (IPD) component comprises an output prematching implementation.

12. The transistor device according to claim 1 wherein the at least one integrated passive device (IPD) component comprises an input prematching implementation.

13. The transistor device according to claim 1 wherein the transistor die comprises one or multiple LDMOS transistor die.

14. The transistor device according to claim 1 wherein the transistor die comprises one or multiple GaN based HEMTs.

15. The transistor device according to claim 14 wherein at least one of the one or multiple GaN based HEMTs comprise a silicon carbide substrate.

16. The transistor device according to claim 1 wherein the transistor device comprises a plurality of the transistor die; and wherein the at least one integrated passive device (IPD) component is a passive device.

17. The transistor device according to claim 16 wherein the plurality of the transistor die are configured in a Doherty configuration.

18. A process for implementing a transistor device, comprising:
   providing a metal submount;
   arranging a transistor die on said metal submount;
   arranging at least one integrated passive device (IPD) component comprising a substrate arranged on said metal submount; and connecting one or more interconnects between the transistor die and the at least one integrated passive device (IPD) component, wherein the substrate of the at least one integrated passive device (IPD) component comprises a silicon carbide (SiC) substrate.

19. The process for implementing a transistor device according to claim 18 further comprising forming at least one via in the substrate to make an electrical connection to the metal submount, wherein the at least one integrated passive device (IPD) component is configured with at least one capacitor, resistor, and/or inductor.

20. The process for implementing a transistor device according to claim 18 wherein the at least one integrated passive device (IPD) component comprises an intervening layer on the substrate of the at least one integrated passive device (IPD) component that comprises a Group III-nitride.

21. The process for implementing a transistor device according to claim 20 wherein the intervening layer comprises Gallium nitride (GaN).

22. The process for implementing a transistor device according to claim 18 wherein the at least one integrated passive device (IPD) component comprises a dielectric layer, a top metal, a bottom metal, and a metallization layer on the substrate of the at least one integrated passive device (IPD) component.

23. The process for implementing a transistor device according to claim 22 wherein the at least one integrated passive device (IPD) component is configured to form a capacitor on the substrate of the at least one integrated passive device (IPD) component with the top metal and the bottom metal having the dielectric layer therebetween.

24. The process for implementing a transistor device according to claim 18 wherein the at least one integrated passive device (IPD) component is configured to form an inductor on the substrate of the at least one integrated passive device (IPD) component.

25. The process for implementing a transistor device according to claim 24 wherein the inductor is implemented as a spiral shaped structure on the substrate of the at least one integrated passive device (IPD) component.

26. The process for implementing a transistor device according to claim 18 wherein the at least one integrated passive device (IPD) component is configured with a plurality of interconnect pads; and wherein the at least one integrated passive device (IPD) component is a passive device.

27. The process for implementing a transistor device according to claim 18 wherein the at least one integrated passive device (IPD) component comprises an interstage matching implementation.

28. The process for implementing a transistor device according to claim 18 wherein the at least one integrated passive device (IPD) component comprises an output pre-matching implementation.

29. The process for implementing a transistor device according to claim 18 wherein the at least one integrated passive device (IPD) component comprises an input pre-matching implementation.

30. The process for implementing a transistor device according to claim 18 wherein the transistor die comprises one or multiple LDMOS transistor die.

31. The process for implementing a transistor device according to claim 18 wherein the transistor die comprises one or multiple GaN based HEMTs.

32. The process for implementing a transistor device according to claim 31 wherein at least one of the one or multiple GaN based HEMTs comprise a silicon carbide substrate.

33. The process for implementing a transistor device according to claim 18 wherein the process for implementing a transistor device comprises a plurality of the transistor die; and wherein the at least one integrated passive device (IPD) component is a passive device.

34. The process for implementing a transistor device according to claim 33 wherein the plurality of the transistor die are configured in a Doherty configuration.

* * * * *